(12) United States Patent
Choi et al.

(10) Patent No.: US 11,756,843 B2
(45) Date of Patent: Sep. 12, 2023

(54) SEMICONDUCTOR DEVICES INCLUDING SCRIBE LANE AND METHOD OF MANUFACTURING THE SEMICONDUCTOR DEVICES

(71) Applicant: Samsung Electronics Co., Ltd., Suwon-si (KR)

(72) Inventors: Minjung Choi, Suwon-si (KR); Junyong Noh, Yongin-si (KR); Yeonjin Lee, Suwon-si (KR); Junghoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/706,401

(22) Filed: Mar. 28, 2022

(65) Prior Publication Data

US 2022/0223485 A1    Jul. 14, 2022

Related U.S. Application Data

(63) Continuation of application No. 16/898,943, filed on Jun. 11, 2020, now Pat. No. 11,342,235.

(30) Foreign Application Priority Data

Dec. 10, 2019    (KR) .................. 10-2019-0163727

(51) Int. Cl.
*H01L 21/00*    (2006.01)
*H01L 21/66*    (2006.01)
*H01L 21/78*    (2006.01)

(52) U.S. Cl.
CPC .............. *H01L 22/34* (2013.01); *H01L 21/78* (2013.01); *H01L 22/32* (2013.01)

(58) Field of Classification Search
CPC .......... H01L 22/34; H01L 21/78; H01L 22/32
USPC ......................................................... 257/48
See application file for complete search history.

(56) References Cited

U.S. PATENT DOCUMENTS

| | | | |
|---|---|---|---|
| 7,405,025 B2 | 7/2008 | Yaegashi |
| 7,642,103 B2 | 1/2010 | Yaegashi |
| 7,704,857 B2 | 4/2010 | Ito |
| 9,508,674 B2 | 11/2016 | Pan et al. |
| 9,773,749 B2 | 9/2017 | Pan et al. |

(Continued)

FOREIGN PATENT DOCUMENTS

| | | |
|---|---|---|
| JP | H11-243120 A | 9/1999 |
| JP | 2006-332177 A | 12/2006 |

(Continued)

*Primary Examiner* — Dzung Tran
(74) *Attorney, Agent, or Firm* — Muir Patent Law, PLLC

(57) ABSTRACT

A semiconductor device includes a substrate including a first part and a second part, a memory cell disposed on the first part, an insulation layer disposed on the first part and the second part, the insulation layer covering the memory cell, a portion of the insulation layer on the second part including a stepped sidewall, and a first pattern group disposed on the second part and in the portion of the insulation layer and the substrate. A first sidewall of the semiconductor device corresponds to the stepped sidewall including an upper sidewall, a lower sidewall and a connecting surface connecting the upper sidewall to the lower sidewall. The lower sidewall disposed under the upper sidewall is closer to the substrate than the upper sidewall, and has surface roughness different from surface roughness of the upper sidewall.

7 Claims, 22 Drawing Sheets

(56) References Cited

U.S. PATENT DOCUMENTS

| | | |
|---|---|---|
| 10,134,706 B2 | 11/2018 | Pan et al. |
| 2012/0119206 A1 | 5/2012 | Wang |
| 2012/0119208 A1 | 5/2012 | Shin |
| 2019/0181063 A1 | 6/2019 | Liao et al. |

FOREIGN PATENT DOCUMENTS

| | | |
|---|---|---|
| JP | 2008-098271 A | 4/2008 |
| JP | 4972278 B2 | 4/2012 |
| JP | 2014-090012 A | 5/2014 |
| KR | 10-1562709 B1 | 10/2015 |

SEMICONDUCTOR DEVICES INCLUDING SCRIBE LANE AND METHOD OF MANUFACTURING THE SEMICONDUCTOR DEVICES

CROSS-REFERENCE TO RELATED APPLICATION

This U.S. non-provisional patent application is a continuation of U.S. application Ser. No. 16/898,943, filed on Jun. 11, 2020, which claims priority under 35 U.S.C. § 119 to Korean Patent Application No. 10-2019-0163727, filed on Dec. 10, 2019, in the Korean Intellectual Property Office (KIPO), the disclosure of each of which is incorporated by reference herein in its entirety.

BACKGROUND

The inventive concept relates to semiconductor devices including a scribe lane and a method of manufacturing the semiconductor devices.

A process of manufacturing a semiconductor device includes a process of forming a plurality of semiconductor chips and a scribe lane between the plurality of semiconductor chips, on a substrate. A plurality of test patterns and a plurality of algin key patterns may be disposed on the scribe lane. Various researches have been developing efficient placements of the plurality of test patterns and the plurality of align key patterns in the scribe lane.

To assess electric properties of elements constituting a semiconductor device (e.g., an integrated circuit chip), a predetermined pattern of measuring elements or test elements (so-called test element group (TEG)) is formed on a scribe lane of a semiconductor wafer. The TEG is electrically tested for determining whether elements are suitably formed in the semiconductor device formed on the semiconductor wafer.

Other than the TEG, various forms of wafer align keys are inserted to the scribe lane for performing a photolithography process. In this scribe lane, various shapes of steppers exist including a laser step alignment mark, a field image align mark, a K-TV, a target for mounting a die, an overlay vernier, a distortion vernier, a rotation vernier and the like.

SUMMARY

The inventive concept provides a semiconductor device where a test pattern and an align key pattern are efficiently disposed and a method of manufacturing the semiconductor device.

According to an exemplary embodiment of the present invention, a semiconductor device includes a substrate including a first part and a second part, a memory cell disposed on the first part, an insulation layer disposed on the first part and the second part, the insulation layer covering the memory cell, a portion of the insulation layer on the second part including a stepped sidewall, and a first pattern group disposed on the second part and in the portion of the insulation layer and the substrate. A first sidewall of the semiconductor device corresponds to the stepped sidewall including an upper sidewall, a lower sidewall and a connecting surface connecting the upper sidewall to the lower sidewall. The lower sidewall disposed under the upper sidewall is closer to the substrate than the upper sidewall, and has surface roughness different from surface roughness of the upper sidewall.

According to an exemplary embodiment of the present invention, a semiconductor device includes a substrate including a first part and a second part connected to a first side of the first part, an insulation layer disposed on the second part and the first part, the insulation layer including an isolation layer in the substrate, a lower insulation layer on the isolation layer and the substrate, a middle insulation layer on the lower insulation layer, and an upper insulation layer on the middle insulation layer, a portion of the insulation layer on the second part including a stepped sidewall, the stepped sidewall including a lower sidewall, an upper sidewall and a connecting surface connecting the lower sidewall and the upper sidewall, the lower sidewall including a sidewall of the isolation layer and a portion of a sidewall of the lower insulation layer, and the upper sidewall including a sidewall of the middle insulation layer and the other portion of the sidewall of the lower insulation layer, a memory cell disposed in the lower insulation layer disposed on the first part, and a first pattern group disposed on the second part of the substrate. A lower sidewall is disposed under the upper sidewall, is closer to the substrate than the upper sidewall, and has surface roughness which is greater than surface roughness of the upper sidewall. The insulation layer is disposed between the stepped sidewall and the first pattern group. The memory cell comprises a cell transistor, a first electrode connected to the cell transistor, a second electrode on the first electrode, and a capacitor dielectric layer between the first electrode and the second electrode.

According to an exemplary embodiment of the present invention, a semiconductor device includes a printed circuit board and semiconductor chips stacked on the printed circuit board. At least one of the plurality of semiconductor chips includes a substrate including a first part and a second part connected to a first side of the first part, an insulation layer disposed on the second part and the first part, the insulation layer including an isolation layer in the substrate, a lower insulation layer on the isolation layer and the substrate, a middle insulation layer on the lower insulation layer, and an upper insulation layer on the middle insulation layer, a portion of the insulation layer on the second part including a stepped sidewall, the stepped sidewall including a lower sidewall, an upper sidewall and a connecting surface connecting the lower sidewall and the upper sidewall, the lower sidewall including a sidewall of the isolation layer and a portion of a sidewall of the lower insulation layer, and the upper sidewall including a sidewall of the middle insulation layer and the other portion of the sidewall of the lower insulation layer, a memory cell disposed in the lower insulation layer disposed on the first part, and a first pattern group disposed on the second part of the substrate. A lower sidewall is disposed under the upper sidewall, is closer to the substrate than the upper sidewall, and has surface roughness which is greater than surface roughness of the upper sidewall. The insulation layer is disposed between the stepped sidewall and the first pattern group. The memory cell comprises a cell transistor, a first electrode connected to the cell transistor, a second electrode on the first electrode, and a capacitor dielectric layer between the first electrode and the second electrode.

According to an exemplary embodiment of the present invention, a method of manufacturing a semiconductor device includes providing a substrate including a first chip region, a second chip region and a scribe lane therebetween, the scribe lane including a first region, a second region and a division region disposed therebetween, forming an insulation layer on the substrate, forming a first pattern group on the first region of the scribe lane, forming a second pattern group on the second region and forming a trench in the insulation layer. The trench overlaps the division region and separates the second pattern group from the first pattern group.

BRIEF DESCRIPTION OF THE DRAWINGS

The inventive concept will be more clearly understood from the following detailed description taken in conjunction with the accompanying drawings in which.

DETAILED DESCRIPTION OF THE EMBODIMENTS

Figure 1:
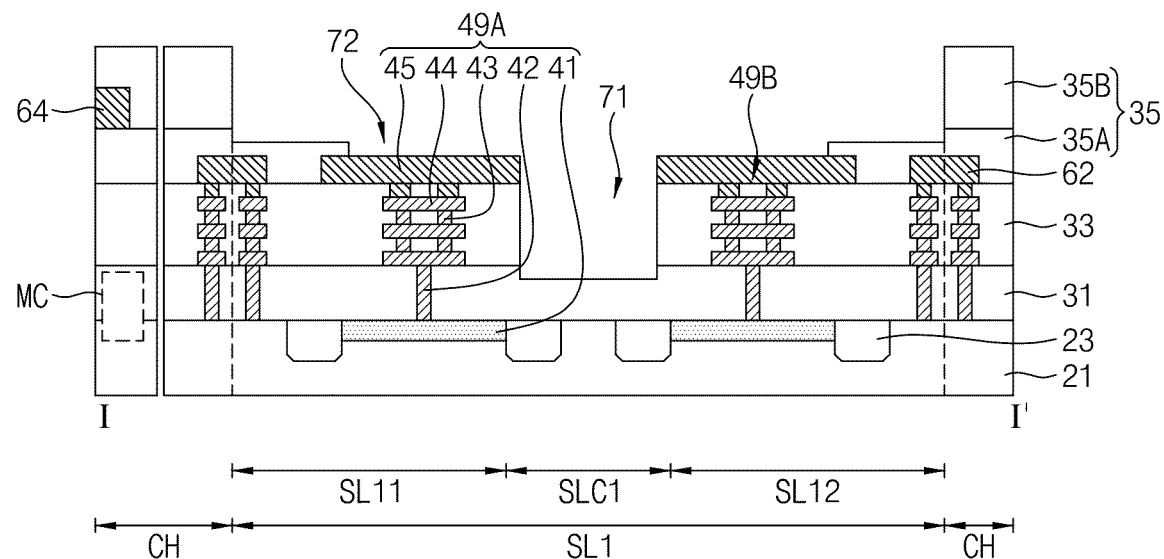
FIGS. 1 and 2 are cross-sectional views for describing a portion of a semiconductor wafer according to an exemplary embodiment of the present inventive concept.
Figure 2:
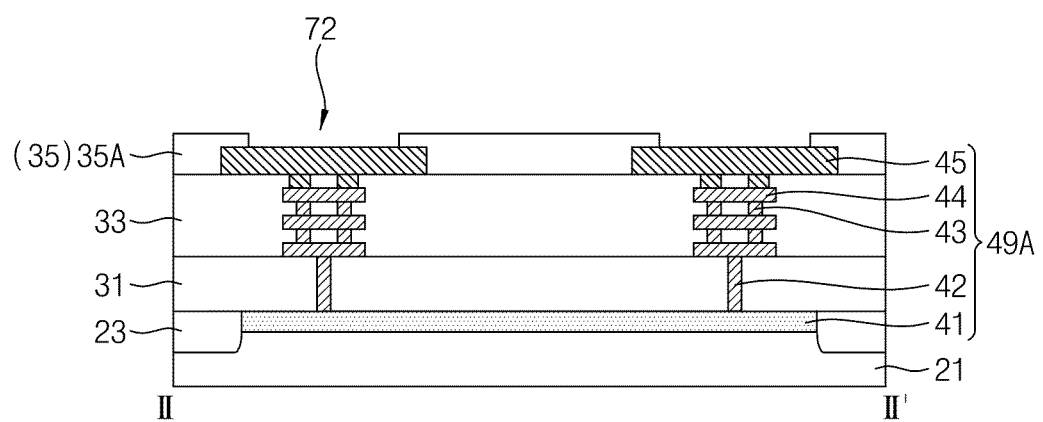
Figure 3:
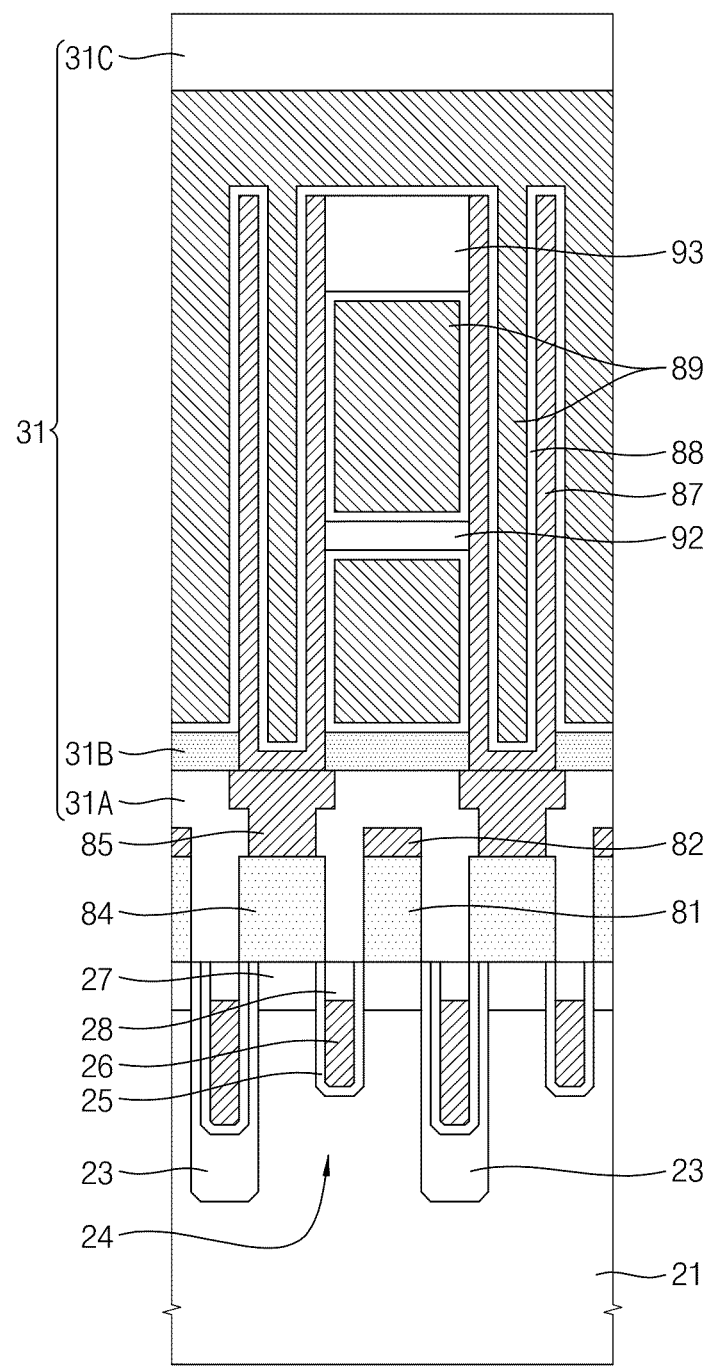
FIGS. 3 and 4 are enlarged views illustrating a portion of FIG. 1 according to an exemplary embodiment of the present inventive concept.
Figure 4:
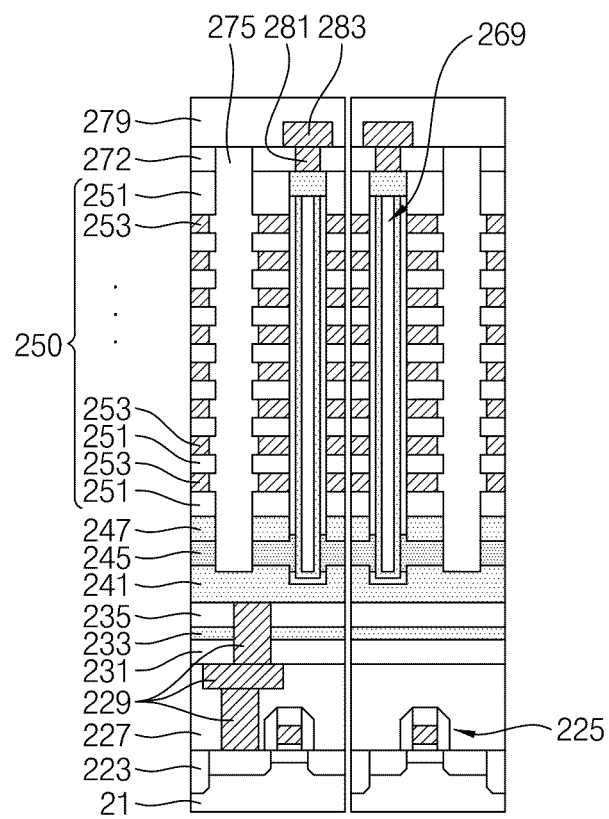
Figure 5:
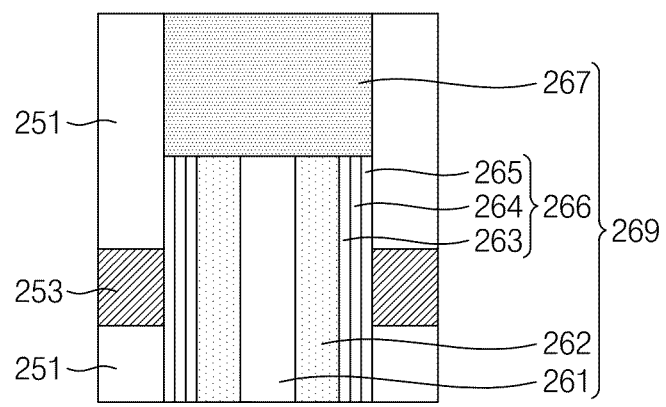
FIG. 5 is an enlarged view illustrating a portion of FIG. 4 according to an exemplary embodiment of the present inventive concept.
Figure 6:
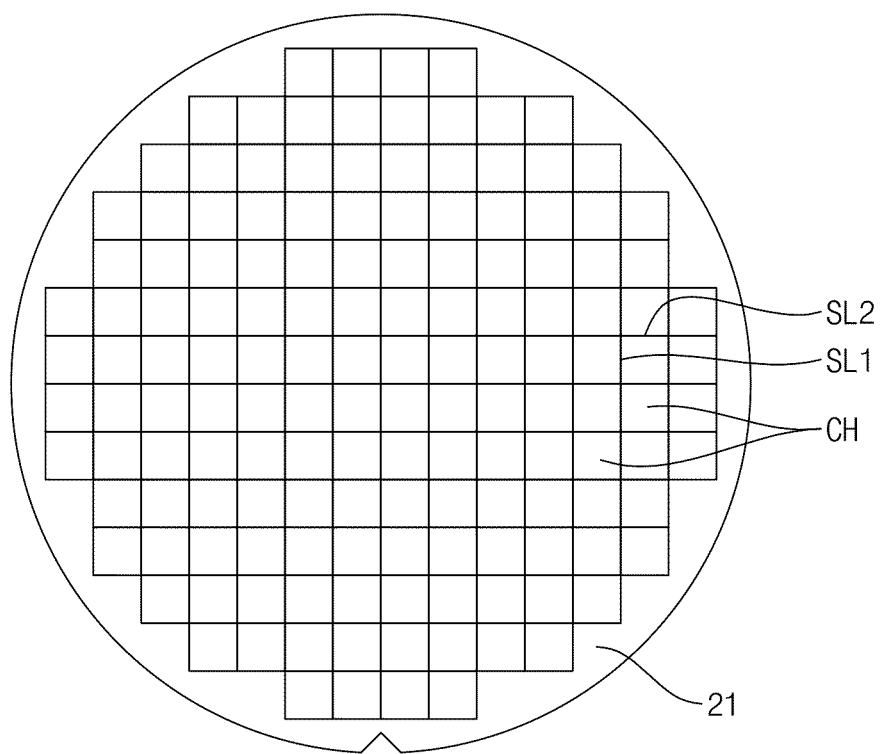
FIG. 6 is a layout for describing semiconductor devices according to an exemplary embodiment of the present inventive concept.
Figure 7:
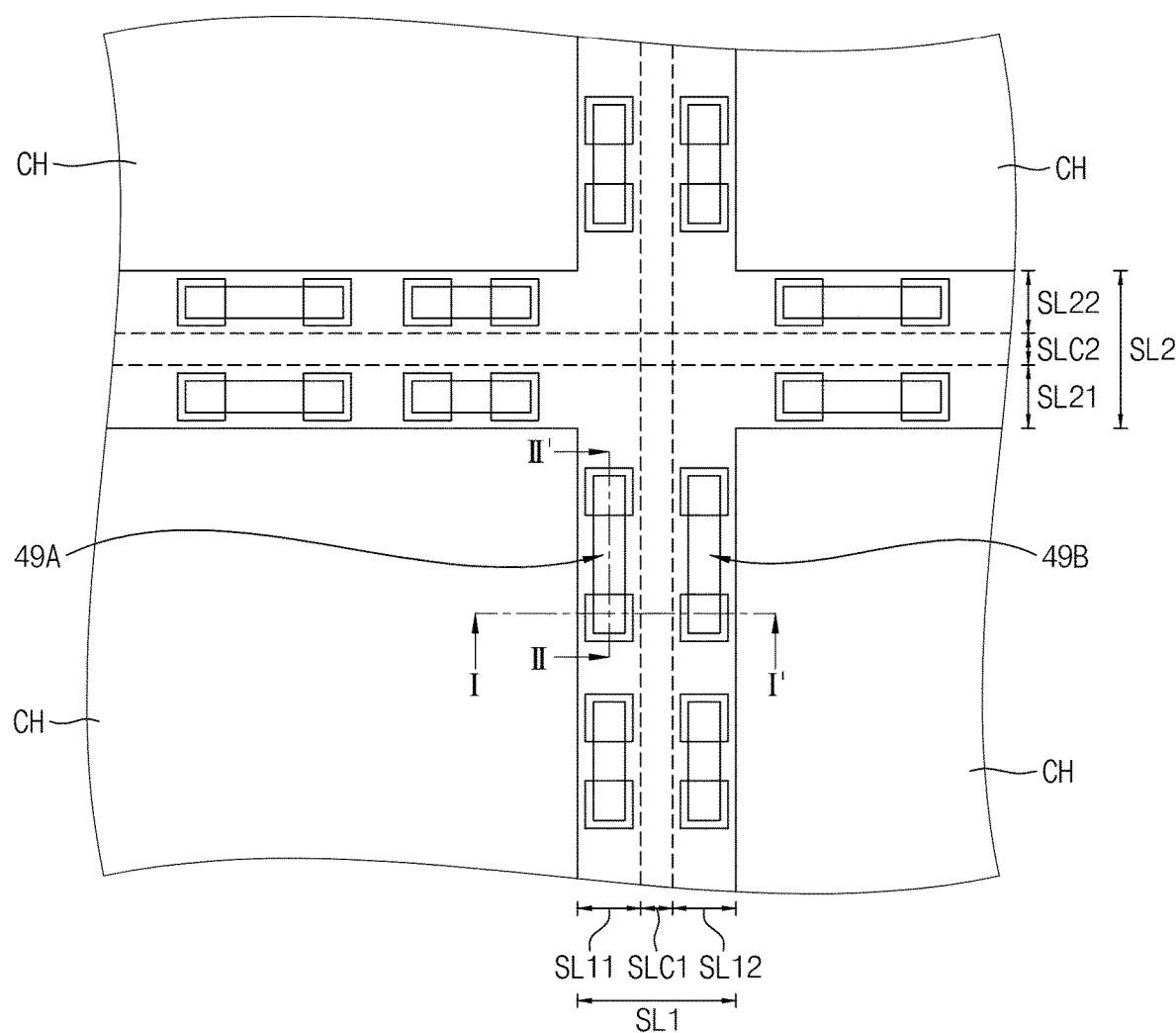
FIGS. 7 and 8 are enlarged views illustrating a portion of FIG. 6 according to an exemplary embodiment of the present inventive concept.
Figure 8:
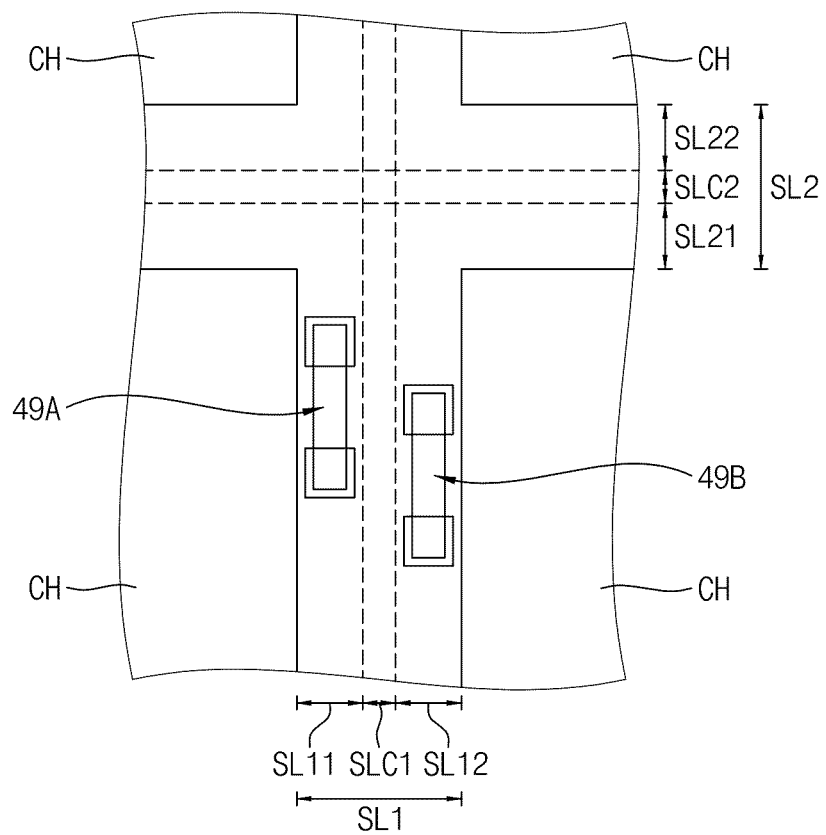

FIGS. 1 and 2 are cross-sectional views for describing a portion of a semiconductor wafer according to an embodiment, and FIGS. 3 and 4 are enlarged views illustrating a portion of FIG. 1. FIG. 5 is an enlarged view illustrating a portion of FIG. 4. FIG. 6 is a layout for describing a semiconductor wafer according to an embodiment, and FIGS. 7 and 8 are enlarged views illustrating a portion of the wafer as shown in FIG. 6. FIG. 1 may be a cross-sectional view taken along line I-I' of FIG. 7. FIG. 2 may be a cross-sectional view taken along line II-IF of FIG. 7.

Referring to FIG. 1, a semiconductor wafer according to an embodiment may include a substrate 21. On the semiconductor wafer, various integrated circuits may be formed using a manufacturing process. For example, the substrate 21 may include a plurality of chip regions CH and a first scribe lane SL1, and the wafer may include a first pattern group 49A, a second pattern group 49B, a plurality of insulation layers 23, 31, 33, and 35, a division hole 71, an opening portion 72, a memory cell MC, a plurality of guard rings 62, and an upper wiring 64 disposed on the substrate 21. In a manufacturing process, the chip regions CH may be separated from the wafer by slicing the wafer via the division hole 71, and the separated chip regions CH may be packaged to semiconductor devices. Each of the chip regions may also be referred to as a first part of the substrate 21, and the first scribe lane may also be referred to as a second part of the substrate 21.

The first scribe lane SL1 may be disposed between the plurality of chip regions CH. The first scribe lane SL1 may include a first region SL11, a second region SL12, and a first division region SLC1. The second region SL12 may be opposite to the first region SL11. The first division region SLC1 may be disposed between the first region SL11 and the second region SL12. The first division region SLC1 may be disposed at a center region between two adjacent chip regions CH. In an embodiment, the first scribe lane SL1 may be referred to as a double scribe lane.

A horizontal width of the first scribe lane SL1 may be about 60 µm to about 130 µm. A horizontal width of the first region SL11 may be about 30 µm to about 60 µm. A horizontal width of the second region SL12 may be about 30 µm to about 60 µm. A horizontal width of the first division region SLC1 may be about 10 µm to about 30 µm. In an embodiment, the horizontal width of the first scribe lane SL1 may be about 120 µm. The horizontal width of the first region SL11 may be about 50 µm. The horizontal width of the second region SL12 may be about 50 µm. The horizontal width of the first division region SLC1 may be about 20 µm. The horizontal width of the first scribe lane SL1 may be measured in a direction perpendicular to a lengthwise direction of the first scribe lane SL1.

The insulation layers 23, 31, 33, and 35 may include an isolation layer 23 buried in the substrate 21, a lower insulation layer 31 disposed on the isolation layer 23 and the substrate 21, a middle insulation layer 33 disposed on the lower insulation layer 31, and an upper insulation layer 35 disposed on the middle insulation layer 33. The upper insulation layer 35 may include a first upper insulation layer 35A and a second upper insulation layer 35B disposed on the first upper insulation layer 35A. For the convenience of description, the isolation layer 23, the lower insulation layer 31 and the middle insulation layer 33 may be collectively referred to as a bottom insulation layer.

Each of the first pattern group 49A and the second pattern group 49B may include a test element group (TEG), an align key pattern, or a combination thereof. In an embodiment, each of the first pattern group 49A and the second pattern group 49B may include a test pad 45, a plurality of middle wirings 44, a plurality of middle plugs 43, a lower plug 42, and a test pattern 41. The test pad 45, the plurality of middle wirings 44, the plurality of middle plugs 43, the lower plug 42, and the test pattern 41 may form the TEG for assessing electric properties of elements constituting an integrated circuit chip (e.g., the chip regions CH). The TEG may be electrically tested for determining whether elements of the chip regions CH are suitably formed on the wafer in a manufacturing process.

The memory cell MC may be disposed (i.e., buried) in the lower insulation layer 31 of the plurality of chip regions CH. The memory cell MC may include a dynamic random access memory (DRAM) cell, a static random access memory (SRAM) cell, a flash memory cell, a magneto-resistive random access memory (MRAM) cell, a phase-change random access memory (PRAM) cell, a ferroelectric random access memory (FeRAM) cell, a resistive random access memory (RRAM) cell, or a combination thereof.

The substrate 21 may include a semiconductor substrate such as a silicon wafer or a silicon on insulator (SOI) wafer. The insulation layers 23, 31, 33, and 35 may cover the substrate 21. The isolation layer 23 may be formed to be buried in the substrate 21. The lower insulation layer 31, the middle insulation layer 33, the first upper insulation layer 35A, and the second upper insulation layer 35B may be sequentially stacked on the substrate 21. The insulation layers 23, 31, 33, and 35 may include a plurality of insulating material layers. Each of the insulation layers 23, 31, 33, and 35 may include silicon oxide, silicon nitride, silicon oxynitride, a low-K dielectric material, a high-K dielectric material, or a combination thereof. The second upper insulation layer 35B may include a photosensitive polyimide (PSPI). The middle insulation layer 33 may include a material layer which is greater in tensile strength than the lower insulation layer 31. For example, the middle insulation layer 33 may include a silicon carbon nitride (SiCN) layer.

In an exemplary embodiment, each of the first upper insulation layer 35A and the second upper insulation layer 35B may include a single layer or a multi-layered structure. Each of the first upper insulation layer 35A and the second upper insulation layer 35B may include a first oxide layer such as high-density plasma (HDP) oxide, a second oxide layer formed using tetraethyl orthosilicate (TEOS) or fluorinated tetraethyl orthosilicate (FTEOS), or a combination thereof.

The first pattern group 49A may be disposed on the first region SL11 of the first scribe lane SL1. The second pattern group 49B may be disposed on the second region SL12 of the first scribe lane SL1. The first division region SLC1 may be interposed between the first region SL11 and the second region SL12. The second pattern group 49B may be separated from the first pattern group 49A by the first division region SLC1. The second pattern group 49B may be electrically/spatially separated from the first pattern group 49A by the first division region SLC1. For example, the division hole 71 may be formed to overlap the first division region SLC1. The division hole 71 may separate the second pattern group 49B from the first pattern group 49A. Each of the first pattern group 49A and the second pattern group 49B may include the TEG.

In an embodiment, the test pattern 41 may be disposed (i.e., buried) in the substrate 21. The test pattern 41 may include a material layer which is formed simultaneously with at least one of various kinds of active/passive elements disposed in the plurality of chip regions CH. For example, the test pattern 41 may be limited in the substrate 21 by the isolation layer 23. The isolation layer 23 may surround a side surface of the test pattern 41. The lower plug 42 may pass through the lower insulation layer 31 and may contact the test pattern 41. The term "contact," as used herein, refers to a direct connection (i.e., touching) unless the context indicates otherwise.

The plurality of middle plugs 43 and the plurality of middle wirings 44 may be disposed in the middle insulation layer 33. At least one of the plurality of middle wirings 44 may be disposed on the lower insulation layer 31 and may contact the lower plug 42. The plurality of middle plugs 43 may be disposed between the plurality of middle wirings 44 and between the uppermost one of the plurality of middle wirings 44 and the test pad 45. The test pad 45 may be disposed in the first upper insulation layer 35A. The test pad 45 may be disposed on the middle insulation layer 33 and may contact at least one of the plurality of middle plugs 43 (e.g., the uppermost one of the plurality of middle wirings 44). The test pad 45 may be electrically connected to the test pattern 41 via the lower plug 42, the plurality of middle plugs 43, and the plurality of middle wirings 44.

The test pad 45, the plurality of middle wirings 44, the plurality of middle plugs 43, and the lower plug 42 may each include metal, metal nitride, metal silicide, metal oxide, conductive carbon, or a combination thereof. The test pad 45, the plurality of middle wirings 44, the plurality of middle plugs 43, and the lower plug 42 may each include aluminum (Al), copper (Cu), nickel (Ni), cobalt (Co), silver (Ag), platinum (Pt), ruthenium (Ru), tungsten (W), tungsten nitride (WN), titanium (Ti), titanium nitride (TiN), tantalum (Ta), tantalum nitride (TaN), or a combination thereof. In an embodiment, the test pattern 45 may include a material layer which differs from the plurality of middle wirings 44. For example, the test pattern 45 may include an Al layer, and the plurality of middle wirings 44 may include a Cu layer.

The opening portion 72 may be disposed on the first scribe lane SL1 and may extend into the upper insulation layer 35. For example, the opening portion 72 may pass through the second upper insulation layer 35B and may extend into an inner portion of the first upper insulation layer 35A. An upper surface of the test pad 45 may be exposed at a bottom of the opening portion 72. The opening portion 72 may be connected to the division hole 71.

The division hole 71 may overlap the first division region SLC1 and may extend into an inner portion of each of the insulation layers 23, 31, 33, and 35. In an embodiment, the division hole 71 may pass through the upper insulation layer 35 and the middle insulation layer 33 and may extend into the inner portion of the lower insulation layer 31. A bottom of the division hole 71 may be disposed at a level which is lower than an uppermost end (or an upper surface) of the lower insulation layer 31. A distance between a lowermost end of the division hole 71 and the substrate 21 may be shorter than a distance between the uppermost end of the lower insulation layer 31 and the substrate 21. The lowermost end of the division hole 71 may be disposed at a level which is lower than an uppermost end of the memory cell MC. The distance between the lowermost end of the division hole 71 and the substrate 21 may be shorter than a distance between the uppermost end of the memory cell MC and the substrate 21.

The distance between the lowermost end of the division hole 71 and the substrate 21 may be shorter than a distance between an uppermost end of the test pad 45 and the substrate 21. The lowermost end of the division hole 71 may be disposed at a level which is lower than a lowermost end of each of the plurality of middle wirings 44. The distance between the lowermost end of the division hole 71 and the substrate 21 may be shorter than a distance between a lowermost end of each of the plurality of middle wirings 44 and the plurality of middle plugs 43 and the substrate 21.

The plurality of guard rings 62 may be disposed at a boundary between the plurality of chip regions CH and the first scribe lane SL1. The plurality of guard rings 62 may each include metal, metal nitride, metal silicide, metal oxide, conductive carbon, or a combination thereof. The upper wiring 64 may be disposed in the upper insulation layer 35 of each of the plurality of chip regions CH. The upper wiring 64 may be disposed on the first upper insulation layer 35A. The second upper insulation layer 35B may cover the upper wiring 64. The upper wiring 64 may include metal, metal nitride, metal silicide, metal oxide, conductive carbon, or a combination thereof. In an embodiment, the upper wiring 64 may include the same material layer as the test pad 45. The upper wiring 64 may include an Al layer. The upper wiring 64 may be two or more times thicker than each of the plurality of middle wirings 44. The upper wiring 64 may correspond to a thick top metal (TTM) wiring.

Referring to FIG. 2 that shows a cross-sectional view of the wafer taken along II-II' of FIG. 7, the wafer according to an embodiment may include the first pattern group 49A, the isolation layer 23, the lower insulation layer 31, the middle insulation layer 33, the first upper insulation layer 35A, and the opening portion 72 disposed on the substrate 21. The first pattern group 49A may include the plurality of test pads 45, the plurality of middle wirings 44, the plurality of middle plugs 43, the plurality of lower plugs 42, and the test pattern 41.

Referring to FIG. 3, the memory cell MC may include a DRAM cell, for example. The memory cell MC may include the substrate 21, the isolation layer 23, an active region 24, a gate dielectric layer 25, a gate electrode 26, a plurality of source/drain regions 27, a gate capping layer 28, a first lower insulation layer 31A, a bit plug 81, a bit line 82, a buried contact plug 84, a landing pad 85, a second lower insulation layer 31B, a first electrode 87, a capacitor dielectric layer 88, a second electrode 89, a lower supporter 92, an upper supporter 93, and a third lower insulation layer 31C.

The active region 24, the gate dielectric layer 25, the gate electrode 26, and the plurality of source/drain regions 27 may configure a cell transistor. The cell transistor may correspond to a recess channel transistor. In an embodiment, the cell transistor may include a fin field effect transistor (finFET), a multi-bridge channel (MBC) transistor, a nanowire transistor, a vertical transistor, a recess channel transistor, a three-dimensional (3-D) transistor, a planar transistor, or a combination thereof.

The first electrode 87 may be connected to the cell transistor. For example, the first electrode 87 may be connected to one source/drain region selected from among the plurality of source/drain regions 27 via the landing pad 85 and the buried contact plug 84. The first electrode 87 may be referred to as a bottom electrode, a storage electrode, or a storage node. The first electrode 87 may include a pillar structure, a cylinder structure, or a combination thereof. The second electrode 89 may be disposed on the first electrode 87. The second electrode 89 may be referred to as a top electrode, a plate electrode, or a plate node. The capacitor dielectric layer 88 may be disposed between the first electrode 87 and the second electrode 89. The first electrode 87, the capacitor dielectric layer 88, and the second electrode 89 may configure a cell capacitor. The cell capacitor may include various kinds of 3-D capacitors.

Each of the lower supporter 92 and the upper supporter 93 may contact a side surface of the first electrode 87. The second electrode 89 may cover the lower supporter 92 and the upper supporter 93. The capacitor dielectric layer 88 may extend between the second electrode 89 and the lower supporter 92 and between the second electrode 89 and the upper supporter 93.

The isolation layer 23 may be formed in the substrate 23 by using a shallow trench isolation (STI) technology. The active region 24 may be isolated in the substrate 21 by the isolation layer 23. Each of the plurality of gate electrodes 26 may be disposed at a level which is lower than an upper end (i.e., an upper surface) of the substrate 21. The gate dielectric layer 25 may surround side surfaces and bottoms of the plurality of gate electrodes 26. The gate dielectric layer 25 may be disposed between the plurality of gate electrodes 26 and the substrate 21. The gate capping layer 28 may be disposed on the plurality of gate electrodes 26. The plurality of source/drain regions 27 may be disposed adjacent to the plurality of gate electrodes 26 in the substrate 21.

Each of the gate electrode 26, the bit plug 81, the bit line 82, the buried contact plug 84, the landing pad 85, the first electrode 87, and the second electrode 89 may include metal, metal nitride, metal silicide, metal oxide, conductive carbon, or a combination thereof. Each of the gate dielectric layer 25 and the capacitor dielectric layer 88 may include silicon oxide, silicon nitride, silicon oxynitride, high-K dielectrics, or a combination thereof.

The lower insulation layer (31 of FIG. 1) may include the first lower insulation layer 31A, the second lower insulation layer 31B, and the third lower insulation layer 31C. In an embodiment, each of the first lower insulation layer 31A and the third lower insulation layer 31C may include silicon oxide, silicon nitride, silicon oxynitride, low-K dielectrics, high-K dielectrics, or a combination thereof. Each of the second lower insulation layer 31B, the lower supporter 92, and the upper supporter 93 may include silicon nitride.

Referring to FIG. 4, the memory cell MC may include a flash memory cell such as a vertical NAND (VNAND) memory cell, for example. The memory cell MC may include a cell on peripheral (COP) structure. For example, the memory cell MC may include the substrate 21, an isolation layer 223, a plurality of transistors 225, a first lower insulation layer 227, a plurality of peripheral circuit wirings 229, a second lower insulation layer 231, a third lower insulation layer 233, a fourth lower insulation layer 235, a horizontal conductive layer 241, a connection conductive layer 245, a supporter 247, a stacked structure 250, a plurality of cell channel structures 269, a fifth lower insulation layer 272, a plurality of separation patterns, a sixth lower insulation layer 279, a plurality of bit plugs 281, and a plurality of bit lines 283.

The lower insulation layer (31 of FIG. 1) may include the first lower insulation layer 227, the second lower insulation layer 231, the third lower insulation layer 233, the fourth lower insulation layer 235, the fifth lower insulation layer 272, and the sixth lower insulation layer 279. The third lower insulation layer 233 may correspond to a capping layer. The stacked structure 250 may include a plurality of insulation layers 251 and a plurality of electrode layers 253, which are alternately and repeatedly stacked.

Referring to FIG. 5, each of the plurality of cell channel structures 269 may include a core pattern 261, a channel layer 262 surrounding an outer portion of the core pattern 261, an information storage pattern 266 surrounding an outer portion of the channel layer 262, and a bit pad 267. The information storage pattern 266 may include a tunnel insulation layer 263 surrounding an outer portion of the channel layer 262, a charge storage layer 264 surrounding an outer portion of the tunnel insulation layer 263, and a blocking layer 265 surrounding an outer portion of the charge storage layer 264.

Referring to FIGS. 4 and 5, the horizontal conductive layer 241 may correspond to a source line or a common source line (CSL). A lowermost layer of the plurality of electrode layers 253 may correspond to a gate-induced drain leakage (GIDL) control line. A second layer upward after the lowermost layer among the plurality of electrode layers 253 may correspond to a ground selection layer (GSL). An uppermost layer of the plurality of electrode layers 253 may correspond to a GIDL control line. Second and third layers downward after the uppermost layer among the plurality of electrode layers 253 may correspond to a ground selection layer (GSL). Some of the plurality of electrode layers 253 may correspond to word lines. The plurality of separation patterns 275 may correspond to word line cut. The plurality of transistors 225 and the plurality of peripheral circuit wirings 229 may configure a peripheral circuit.

Referring to FIG. 6, a semiconductor wafer according to an embodiment may include a plurality of chip regions CH and a plurality of first and second scribe lanes SL1 and SL2 disposed on the substrate 21. The plurality of first and second scribe lanes SL1 and SL2 may be disposed between the plurality of chip regions CH. The plurality of first scribe lanes SL1 may be parallel to one another. The plurality of second scribe lanes SL2 may be parallel to one another. The plurality of second scribe lanes SL2 may intersect the plurality of first scribe lanes SL1. In an exemplary embodiment, the plurality of second scribe lanes SL2 may be perpendicular to the plurality of first scribe lanes SL1. Each of the first scribe lanes SL1 may also be referred to as a second part of the substrate 21, and each of the second scribe lanes SL2 may also be referred to as a third part of the substrate 21.

Referring to FIG. 7, first and second scribe lanes SL1 and SL2 may be disposed between a plurality of chip regions CH. The first scribe lane SL1 may include the first region SL11, the second region SL12, and the first division region SLC1. The first pattern group 49A may be disposed on the first region SL11. The second pattern group 49B may be disposed on the second region SL12. As seen in a plan view, the second pattern group 49B may be disposed in parallel with the first pattern group 49A. The first division region SLC1 may be disposed between the first region SL11 and the second region SL12.

In an embodiment, the second scribe lane SL2 may be perpendicular to the first scribe lane SL1. The second scribe lane SL2 may include a third region SL21, a fourth region SL22, and a second division region SLC2. The second division region SLC2 may be disposed between the third region SL21 and the fourth region SL22. The second scribe lane SL2 may include a configuration similar to that of the first scribe lane SL1.

Referring to FIG. 8, as seen in a plan view, a second pattern group 49B may be disposed to be shifted from a first pattern group 49A in a direction in which the first division region SLC1 extends.

FIGS. 9 to 13 are cross-sectional views of a semiconductor wafer taken along line I-I' of FIG. 7, for describing semiconductor devices according to an embodiment.

Figure 9:
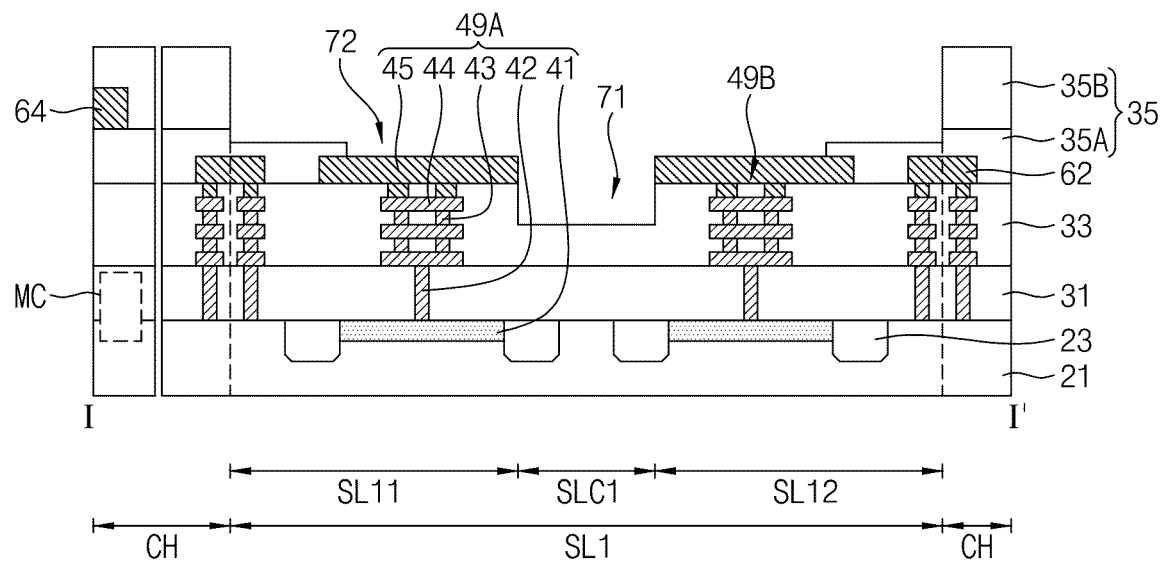
FIGS. 9 to 13 are cross-sectional views of a semiconductor wafer for describing semiconductor devices according to an exemplary embodiment of the present inventive concept.

Referring to FIG. 9, a division hole 71 may be disposed within an opening portion 72 in a top-down view and may extend into an inner portion of a middle insulation layer 33. The division hole 71 may be connected to the opening portion 72. A lowermost end (i.e., a bottom surface) of the division hole 71 may be disposed at a level which is higher than an uppermost end (i.e., an upper surface) of a lower insulation layer 31. The middle insulation layer 33 may be partially recessed to form the division hole 71. For example, the middle insulation layer 33 may be partially recessed to form the division hole 71. The lowermost end of the division hole 71 may be disposed at a level which is higher than an uppermost end of each of a plurality of lower plugs 42.

Figure 10:
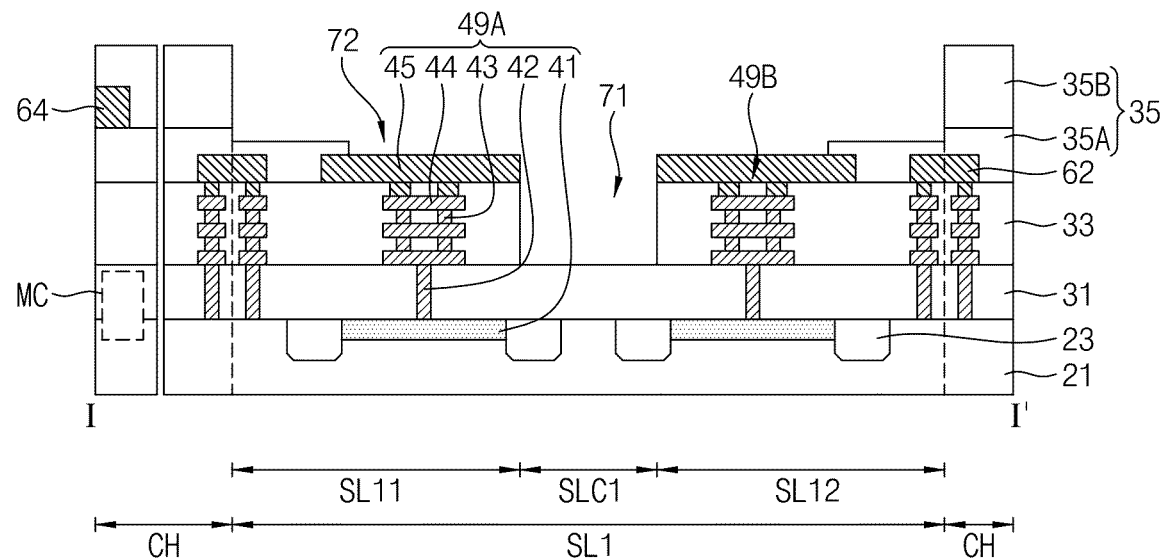

Referring to FIG. 10, a division hole 71 may be disposed within an opening portion 72 in a top-down view. The division hole 71 may pass through a middle insulation layer 33. The division hole 71 may be connected to the opening portion 72. A bottom of the division hole 71 and an upper surface of a lower insulation layer 31 may be substantially coplanar. In an embodiment, the division hole 71 may have various depths.

Figure 11:
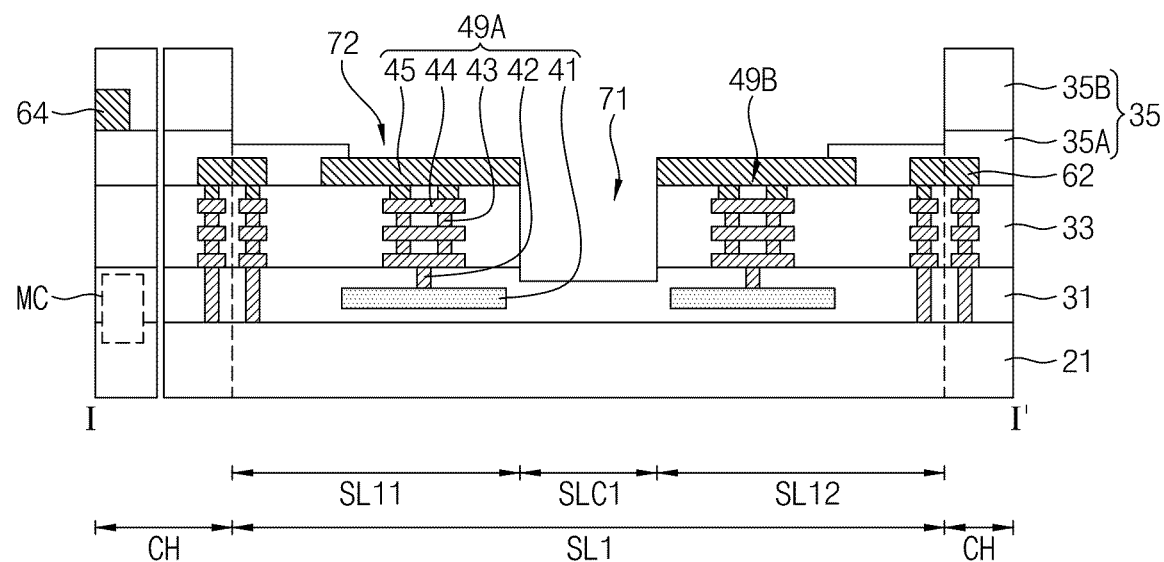

Referring to FIG. 11, a test pattern 41 may be disposed (or buried) in a lower insulation layer 31. In an embodiment, the test pattern 41 may be disposed in an inner portion of a substrate 21, an inner portion of the lower insulation layer 31, or an inner portion of a middle insulation layer 33.

Figure 12:
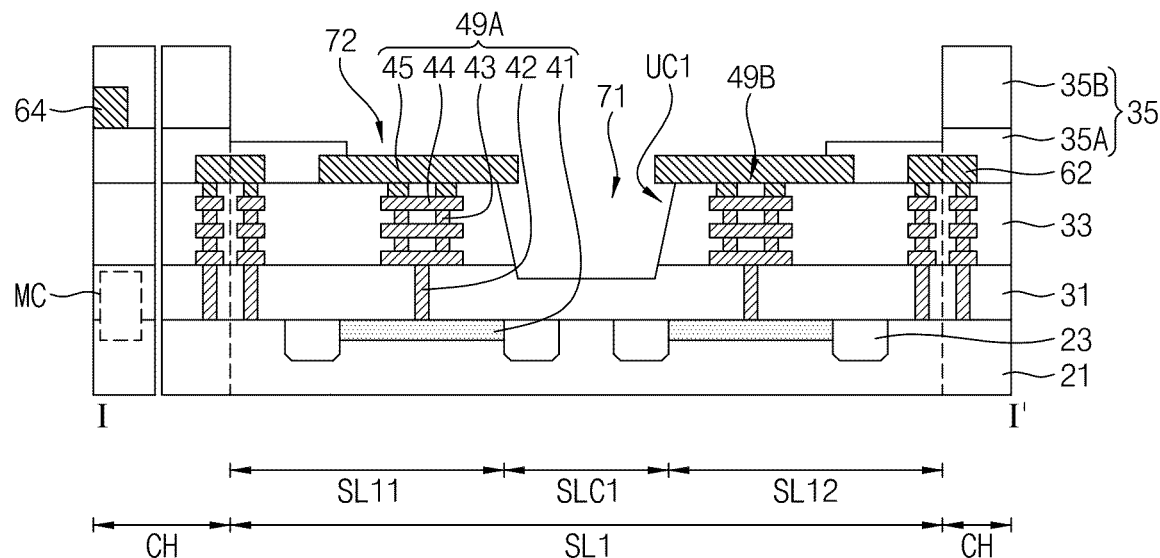

Referring to FIG. 12, sidewalls of a division hole 71 may have various profiles. The sidewalls of the division hole 71 may include various slopes. In an embodiment, the division hole 71 may include a plurality of undercut regions UC1. The undercut regions UC1 may be formed under a test pad 45. A lower surface of the test pad 45 may be partially exposed by the undercut regions UC1.

Figure 13:
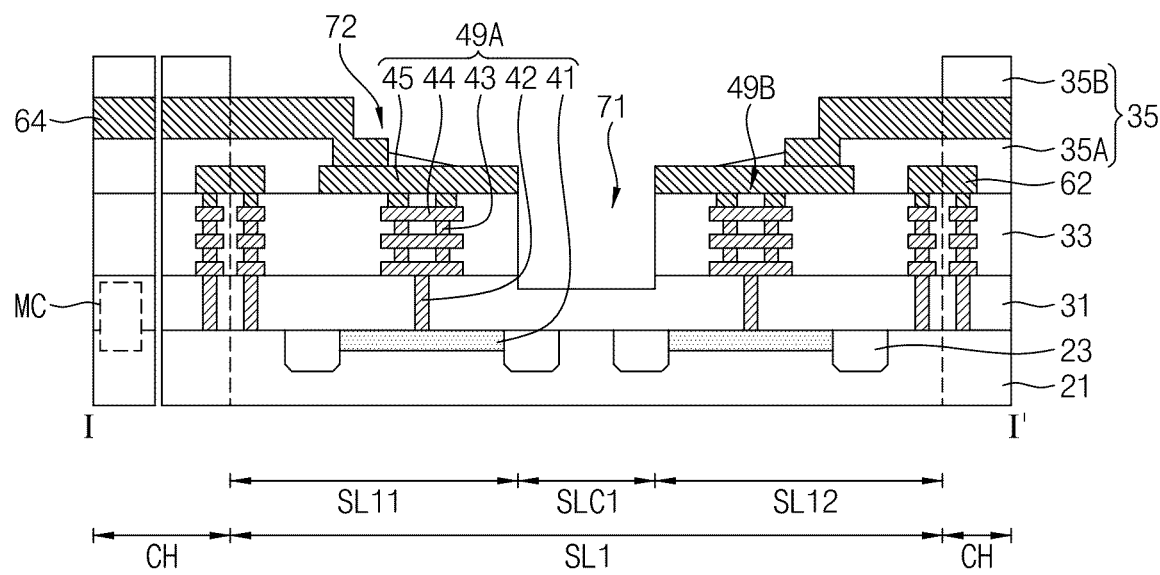

Referring to FIG. 13, an upper wiring 64 may extend from a chip region CH into a first scribe lane SL1. The upper wiring 64 may contact an upper surface of the test pad 45. The upper wiring 64 may correspond go a redistribution layer RDL.

Figure 14:
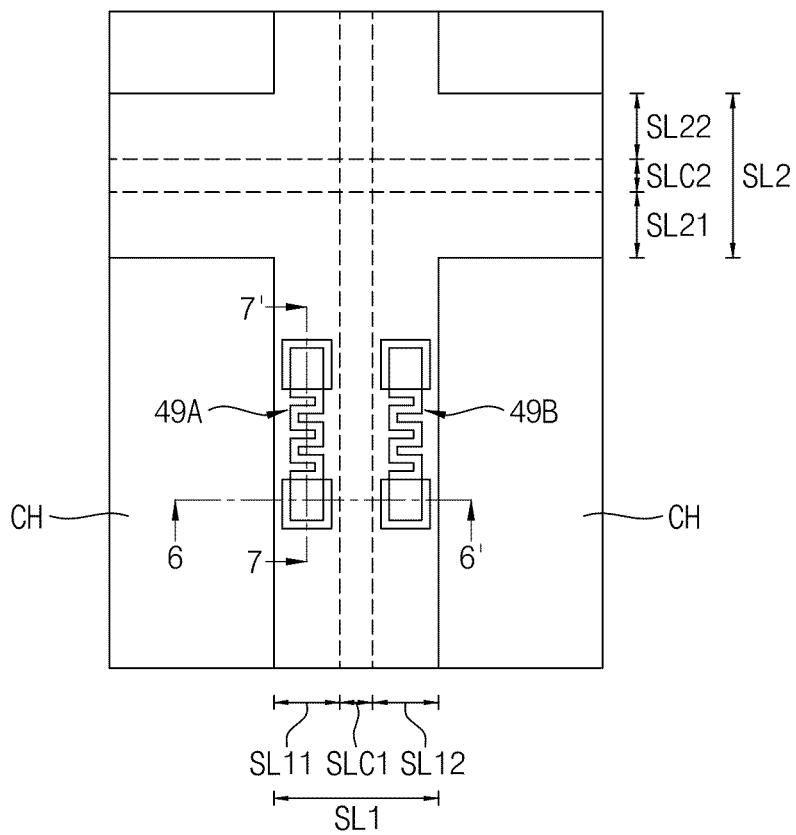
FIG. 14 is an enlarged view illustrating a portion of a semiconductor wafer as shown in FIG. 6 according to an exemplary embodiment of the present inventive concept.
Figure 15:
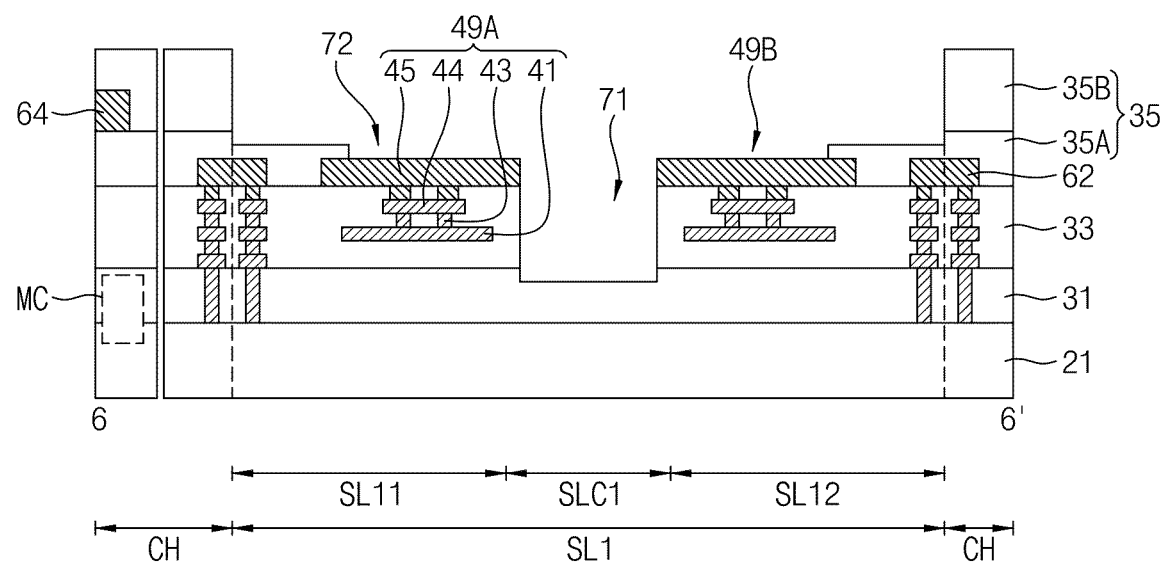
FIGS. 15 and 16 are cross-sectional views for describing semiconductor devices according to an exemplary embodiment of the present inventive concept.
Figure 16:
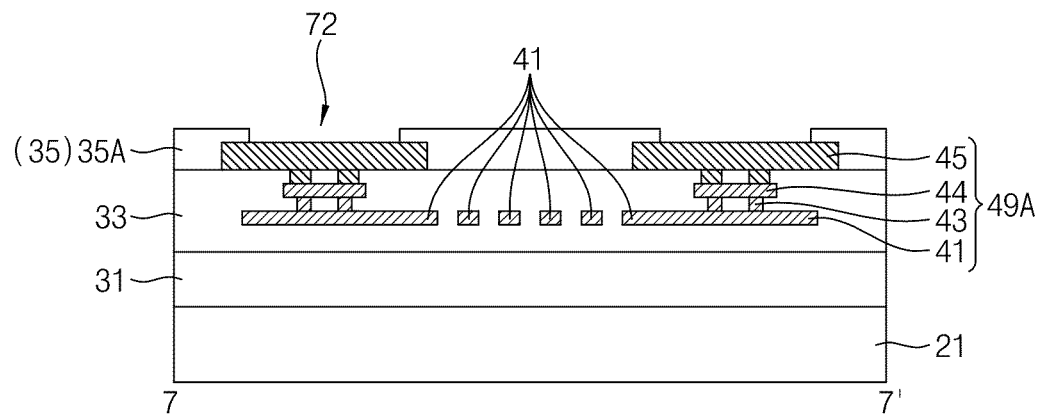

FIG. 14 is an enlarged view illustrating a portion of a semiconductor wafer as shown in FIG. 6, FIG. 15 is a cross-sectional view taken along line 6-6' of FIG. 14, for describing semiconductor devices, and FIG. 16 is a cross-sectional view taken along line 7-7' of FIG. 14.

Referring to FIGS. 14 to 16, a test pattern 41 may include a material layer which is substantially the same as at least one element selected from among various active/passive elements disposed in a substrate 21 and insulation layers 23, 31, 33, and 35. The test pattern 41 may include a material layer which is simultaneously formed by using the same process as at least one element selected from among the various active/passive elements disposed in the substrate 21 and the insulation layers 23, 31, 33, and 35. The test pattern 41 may be disposed at substantially the same level as at least one element selected from among the various active/passive elements disposed in the substrate 21 and the insulation layers 23, 31, 33, and 35. The test pattern 41 may include a 3-D pattern having various structures.

In an embodiment, each of the first pattern group 49A and the second pattern group 49B may include a test pad 45, a middle wiring 44, a plurality of middle plugs 43, and the test pattern 41. The test pattern 41 may be disposed in a middle insulation layer 33. A lowermost end of a division hole 71 may be disposed at a level which is lower than a lowermost end of the test pattern 41. An interval between the lowermost end of the division hole 71 and the substrate 21 may be shorter than an interval between the lowermost end of the test pattern 41 and the substrate 21. The middle insulation layer 33 may be exposed at a sidewall of the division hole 71. The division hole 71 may pass through the middle insulation layer 33 and partially extend into a lower insulation layer 31. A portion of the middle insulation layer 33 may be disposed between the sidewall of the division hole 71 and the test pattern 41, between the sidewall of the division hole 71 and the middle wiring 44, and between the sidewall of the division hole 71 and the plurality of middle plugs 43.

Figure 17:
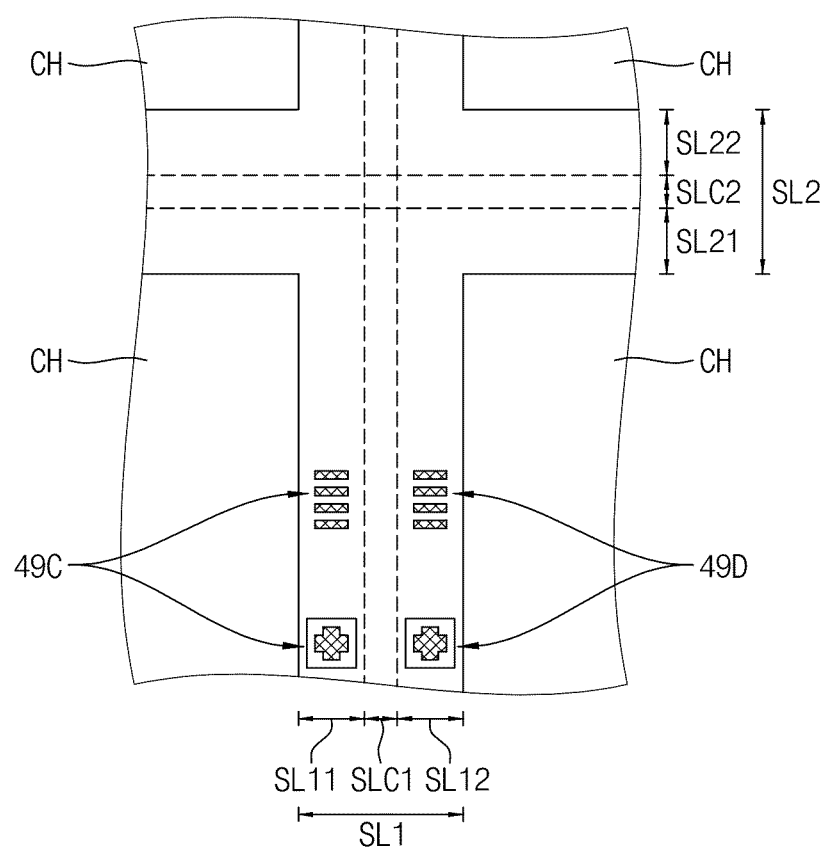
FIGS. 17 and 18 are enlarged views illustrating a portion of a semiconductor wafer as shown in FIG. 6 according to an exemplary embodiment of the present inventive concept.
Figure 18:
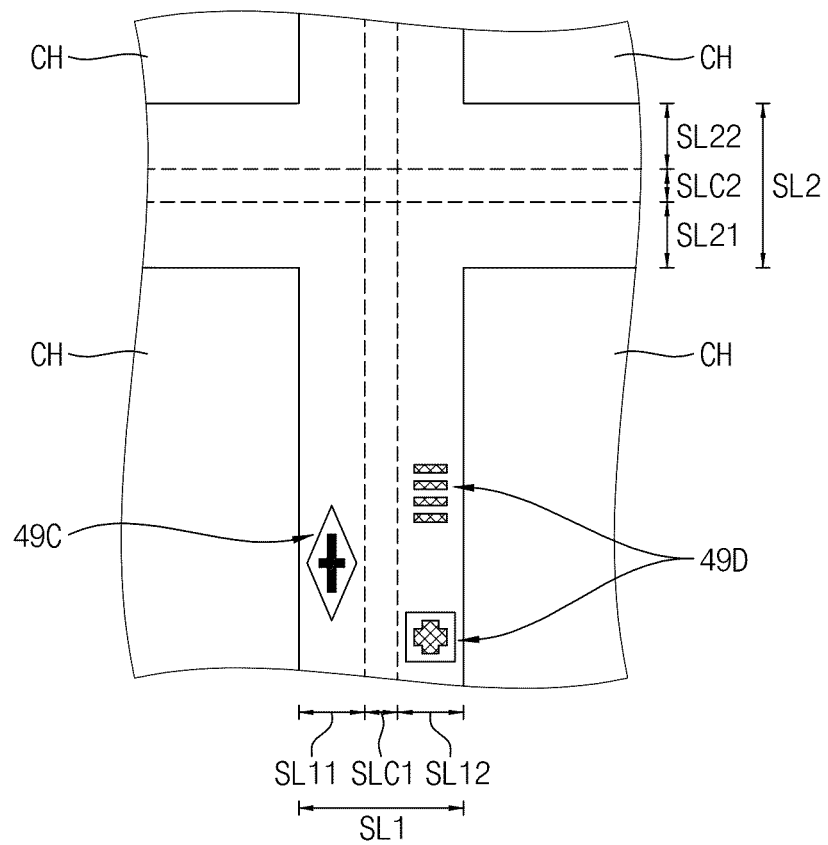

FIGS. 17 and 18 are enlarged views illustrating a portion of a semiconductor wafer as shown in FIG. 6, and FIGS. 19 to 21 are cross-sectional views of the semiconductor wafer for describing semiconductor devices according to an embodiment.

Referring to FIG. 17, each of a first pattern group 49C and a second pattern group 49D may include an align key pattern. The second pattern group 49D may be disposed in parallel with the first pattern group 49C. The second pattern group 49D may include the same align key pattern as that of the first pattern group 49C. The first pattern group 49C may be disposed on a first region SL11 of a first scribe lane SL1. The second pattern group 49D may be disposed on a second region SL12 of the first scribe lane SL1. The second pattern group 49D may be separated from the first pattern group 49C by a first division region SLC1. The second scribe lane SL2 may include a configuration similar to that of the first scribe lane SL1.

Referring to FIG. 18, a second pattern group 49D and a first pattern group 49C may be disposed on opposite sides of a first division region SLC1. The second pattern group 49D may include an align key pattern which differs from that of the first pattern group 49C.

Figure 19:
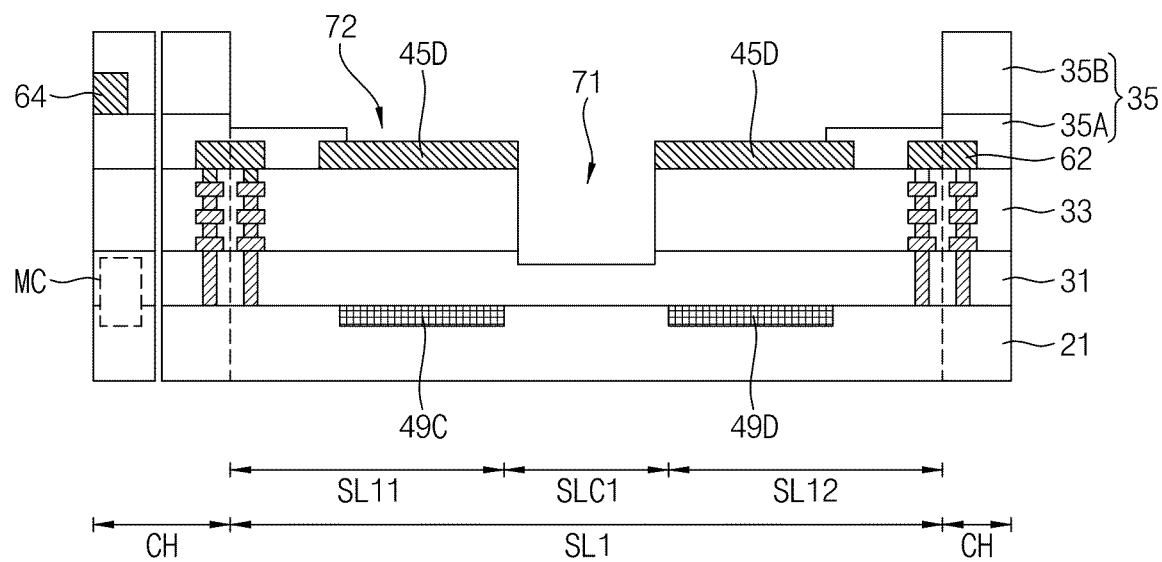
FIGS. 19 to 21 are cross-sectional views of the semiconductor wafer for describing semiconductor devices according to an exemplary embodiment of the present inventive concept.

Referring to FIG. 19, each of a first pattern group 49C and a second pattern group 49D may include an align key pattern. Each of the first pattern group 49C and the second pattern group 49D may be disposed in a substrate 21. A lower insulation layer 31 may cover the first pattern group 49C and the second pattern group 49D. A plurality of dummy metal patterns 45D may be disposed on a middle insulation layer 33. The plurality of dummy metal patterns 45D may cover an upper portion of the first pattern group 49C and an upper portion of the second pattern group 49D.

Figure 20:
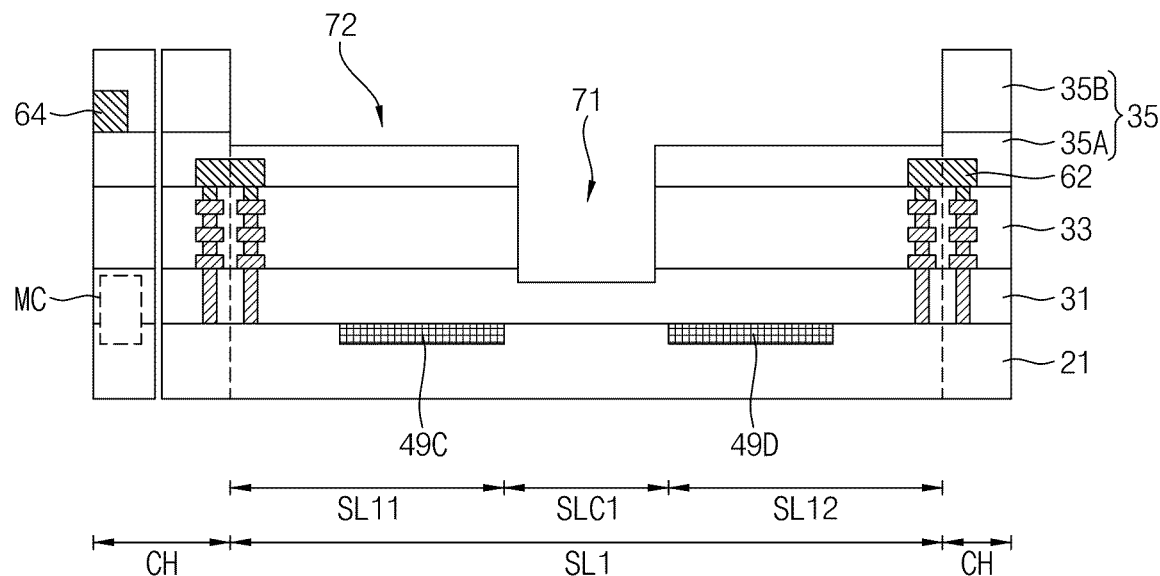

Referring to FIG. 20, in an embodiment, the plurality of dummy metal patterns (45D of FIG. 19) may be omitted.

Figure 21:
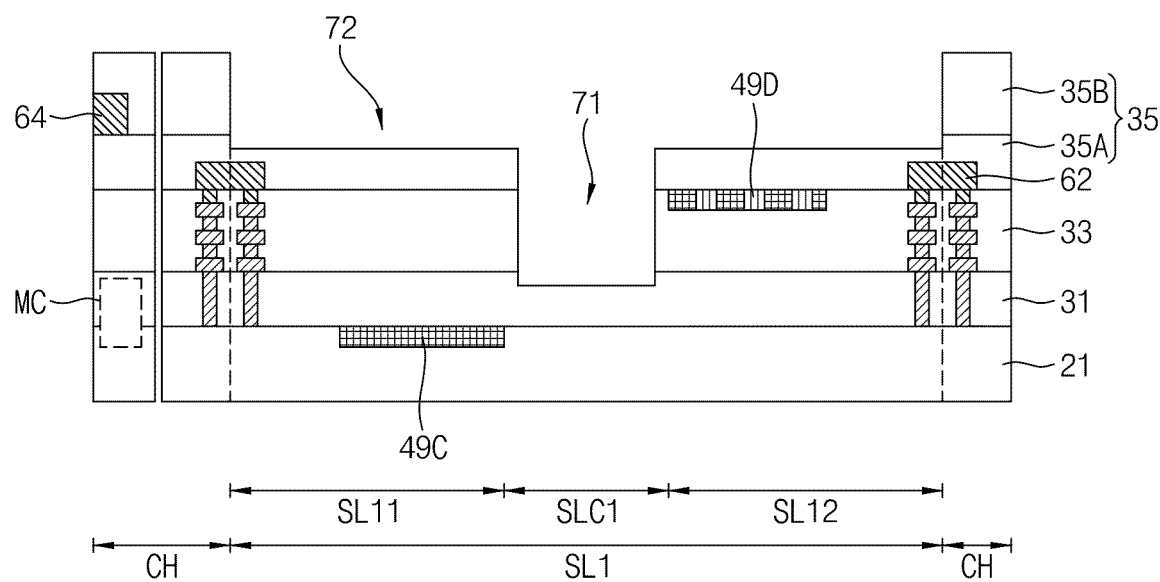

Referring to FIG. 21, a first pattern group 49C and a second pattern group 49D may be disposed at different levels. For example, the first pattern group 49C may be disposed in a substrate 21, and the second pattern group 49D may be disposed in a middle insulation layer 33. The second pattern group 49D may include an align key pattern which differs from that of the first pattern group 49C.

Figure 22:
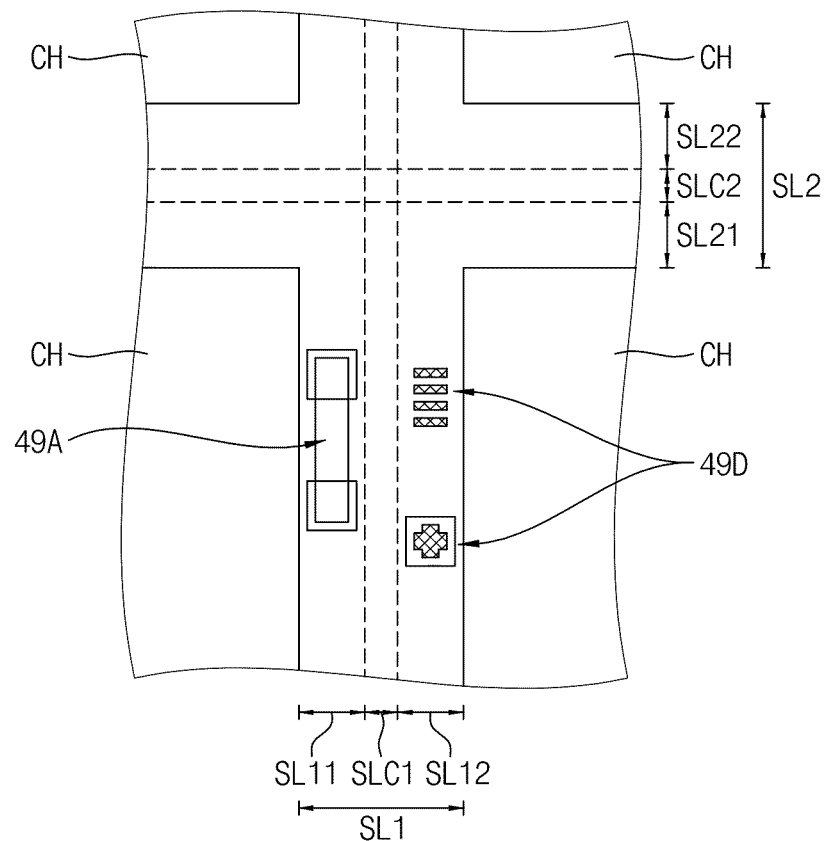
FIG. 22 is an enlarged view illustrating a portion of a semiconductor wafer as shown in FIG. 6 according to an exemplary embodiment of the present inventive concept.
Figure 23:
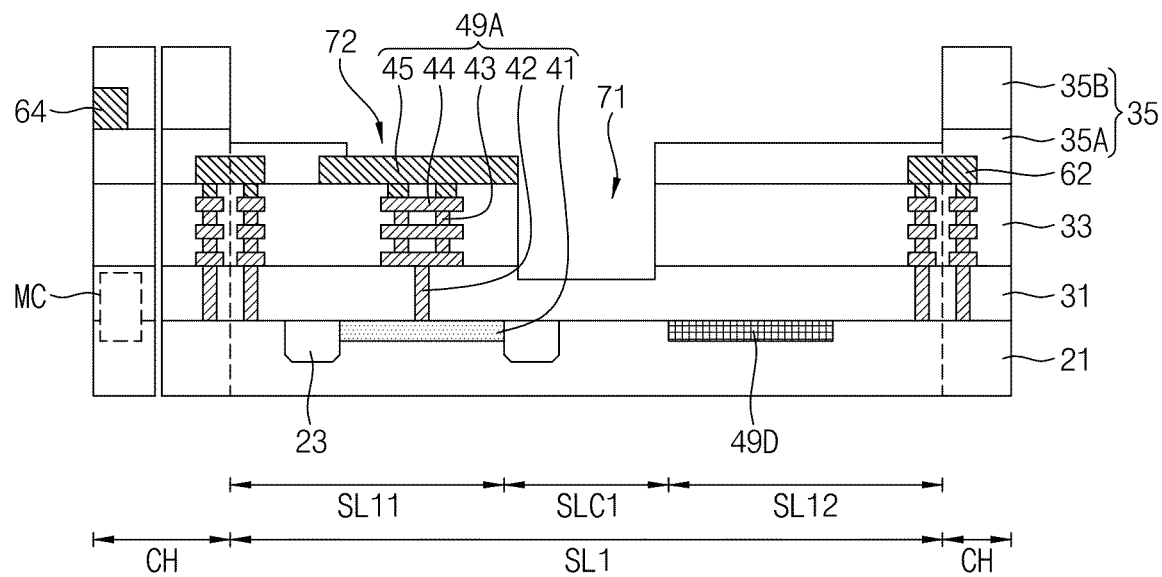
FIG. 23 is a cross-sectional view of a semiconductor wafer for describing semiconductor devices according to an exemplary embodiment of the present inventive concept.

FIG. 22 is an enlarged view illustrating a portion of a semiconductor wafer as shown in FIG. 6, and FIG. 23 is a cross-sectional view of the wafer for describing semiconductor devices according to an embodiment.

Referring to FIG. 22, a second pattern group 49D may include an align key pattern which differs from that of a first pattern group 49A. For example, the first pattern group 49A may include a TEG, and the second pattern group 49D may include an align key pattern.

Referring to FIG. 23, the first pattern group 49A may include the TEG. The first pattern group 49A may include a test pad 45, a plurality of middle wirings 44, a plurality of middle plugs 43, a lower plug 42, and a test pattern 41. The second pattern group 49D may include the align key pattern.

Figure 24:
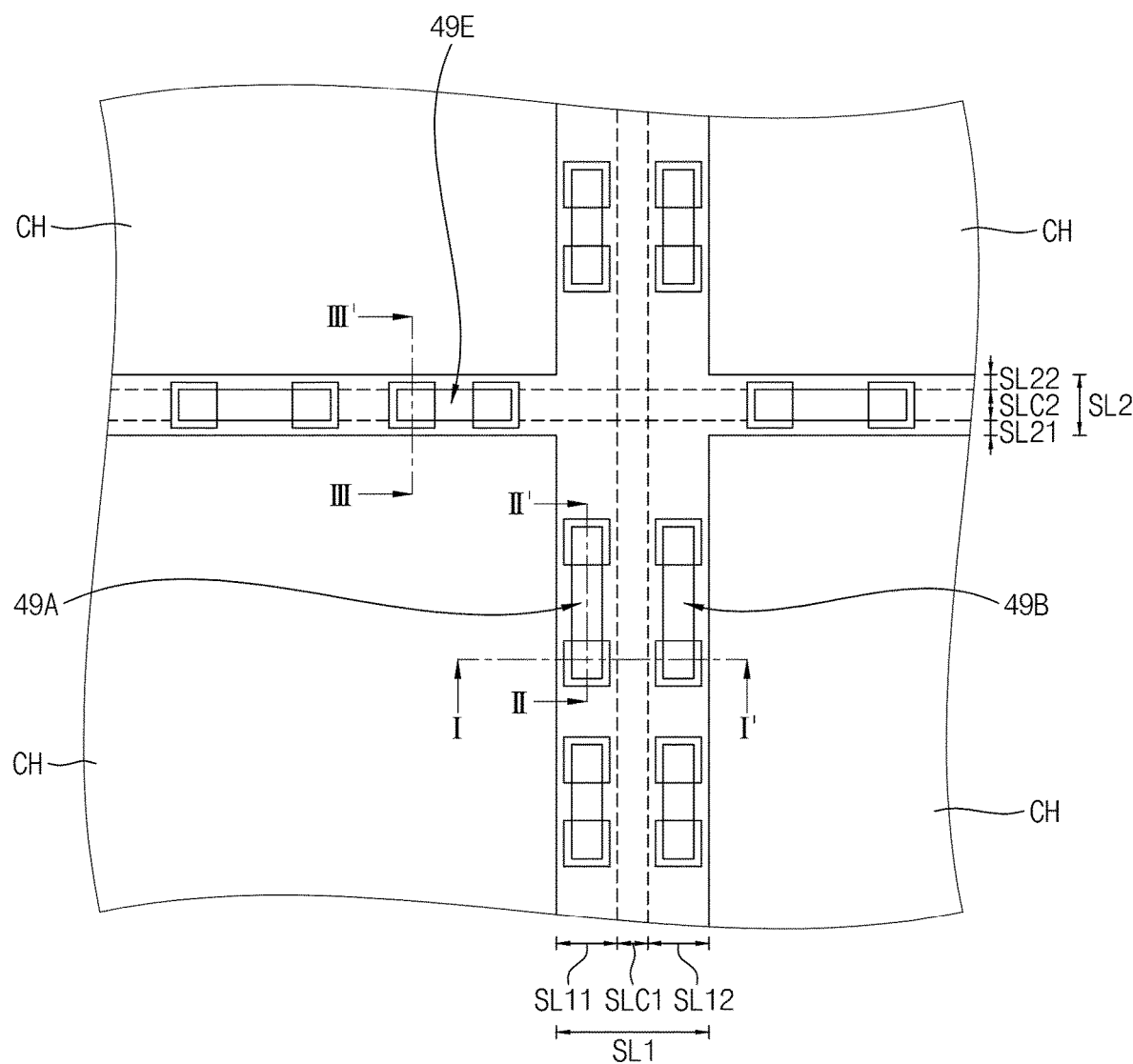
FIG. 24 is an enlarged view illustrating a portion of a semiconductor wafer as shown in FIG. 6 according to an exemplary embodiment of the present inventive concept.
Figure 25:
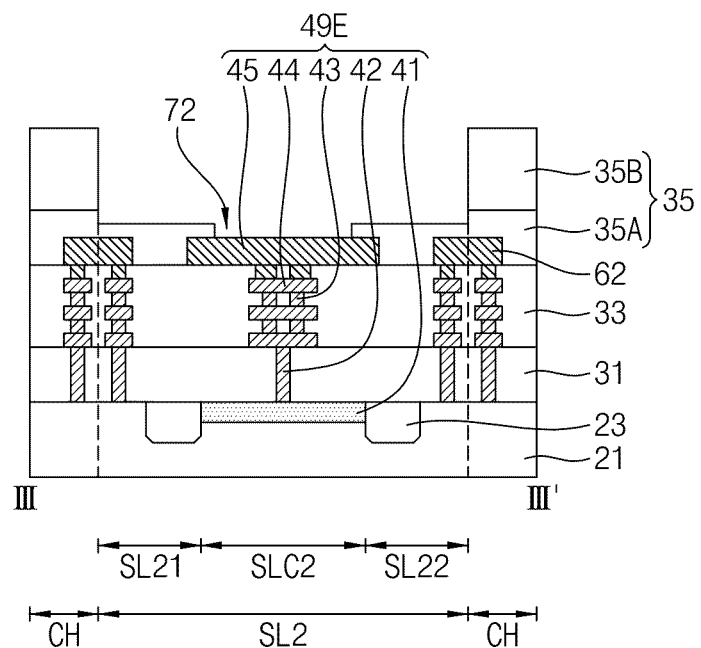
FIG. 25 is a cross-sectional view of a semiconductor wafer for describing semiconductor devices according to an exemplary embodiment of the present inventive concept.

FIG. 24 is an enlarged view illustrating a portion of a semiconductor wafer as shown in FIG. 6, and FIG. 25 is a cross-sectional view of the wafer taken along line of FIG. 24, for describing semiconductor devices according to an embodiment.

Referring to FIGS. 24 and 25, first and second scribe lanes SL1 and SL2 may be disposed between a plurality of chip regions CH. The first scribe lane SL1 may include a first region SL11, a second region SL12, and a first division region SLC1. A first pattern group 49A may be disposed on the first region SL11. A second pattern group 49B may be disposed on the second region SL12. The first division region SLC1 may be disposed between the first region SL11 and the second region SL12.

In an embodiment, the second scribe lane SL2 may be perpendicular to the first scribe lane SL1. The second scribe lane SL2 may include a third region SL21, a fourth region SL22, and a second division region SLC2. The second division region SLC2 may be disposed between the third region SL21 and the fourth region SL22. A horizontal width of the second scribe lane SL2 may differ from that of the first scribe lane SL1. The horizontal width of the second scribe lane SL2 may be narrower than that of the first scribe lane SL1. The horizontal width of the second scribe lane SL2 may be about 40 μm to about 70 μm. A horizontal width of the third region SL21 may be about 30 μm to about 60 μm. A horizontal width of the fourth region SL22 may be about 30 μm to about 60 μm. A horizontal width of the second division region SLC2 may be about 10 μm to about 30 μm. In an embodiment, the horizontal width of the second scribe lane SL2 may be about 60 μm. The horizontal width of the third region SL21 may be about 20 μm. The horizontal width of the fourth region SL22 may be about 20 μm. The horizontal width of the second division region SLC2 may be about 20 μm. In an example embodiment, a horizontal width of a scribe lane may be measured in a direction perpendicular to an extending direction of the scribe lane.

A third pattern group 49E may be disposed on the second scribe lane SL2. The third pattern group 49E may overlap the second division region SLC2. The third pattern group 49E may overlap the third region SL21, the second division region SLC2, and the fourth region SL22. The third pattern group 49E may include a TEG, an align key pattern, or a combination thereof. In an embodiment wherein the third pattern group 49E includes a TEG, the third pattern group 49E may include a test pad 45, a plurality of middle wirings 44, a plurality of middle plugs 43, a lower plug 42, and a test pattern 41. The test pattern 41 may overlap the second division region SLC2.

FIGS. 26 to 29 are cross-sectional views of a semiconductor wafer taken along line I-I' of FIG. 7, for describing methods of manufacturing semiconductor devices according to an embodiment.

Figure 26:
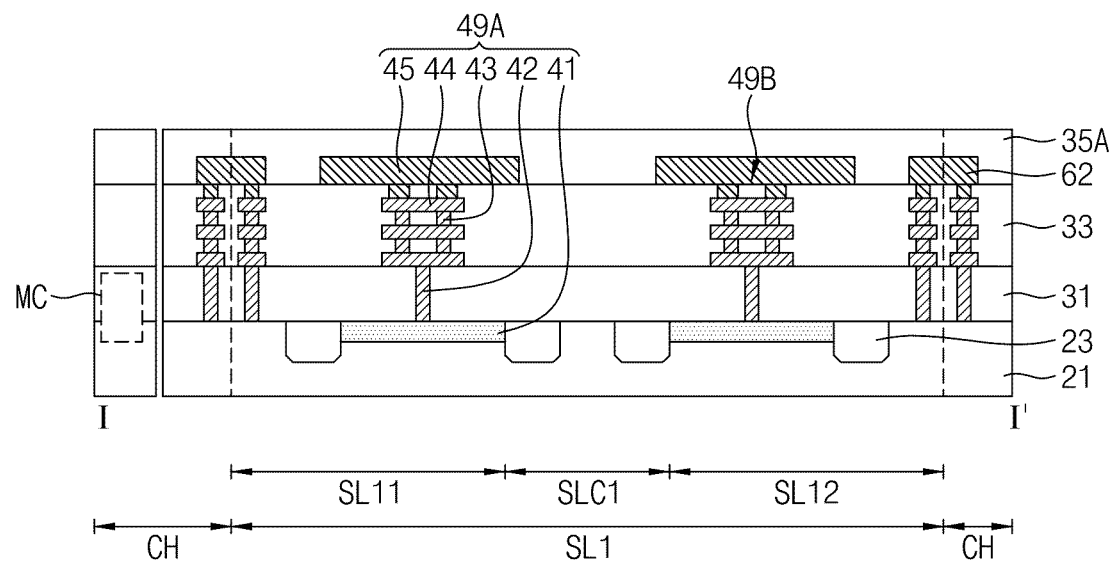
FIGS. 26 to 31 are cross-sectional views of a semiconductor wafer for describing methods of manufacturing semiconductor devices, according to an exemplary embodiment of the present inventive concept.

Referring to FIG. 26, a substrate 21 including a plurality of chip regions CH and a first scribe lane SL1 between the plurality of chip regions CH may be provided. An isolation layer 23 may be formed in the substrate 21. A lower insulation layer 31, a middle insulation layer 33, and a first upper insulation layer 35A may be formed on the substrate 21 and the isolation layer 23. A memory cell MC may be formed in the lower insulation layer 31 of each of the plurality of chip regions CH. A plurality of guard rings 62 may be formed in the lower insulation layer 31, the middle insulation layer 33, and the first upper insulation layer 35A. The plurality of guard rings 62 may be formed at a boundary between the plurality of chip regions CH and the first scribe lane SL1.

A first pattern group 49A and a second pattern group 49B may be formed in the lower insulation layer 31, the middle insulation layer 33, and the first upper insulation layer 35A. Each of the first pattern group 49A and the second pattern group 49B may include a test pad 45, a plurality of middle wirings 44, a plurality of middle plugs 43, a lower plug 42, and a test pattern 41. The test pattern 41 may be formed in the substrate 21. The test pattern 41 may be isolated by the isolation layer 23. The isolation layer 23 may surround a side surface of the test pattern 41. The first pattern group 49A may be formed on the first region SL11. The second pattern group 49B may be formed on a second region SL12 opposite to the first region SL11.

The lower plug 42 may be formed in the lower insulation layer 31. The plurality of middle plugs 43 and the plurality of middle wirings 44 may be formed in the middle insulation layer 33. The test pad 45 may be formed on the middle insulation layer 33. The first upper insulation layer 35A may cover the test pad 45 and the middle insulation layer 33.

Figure 27:
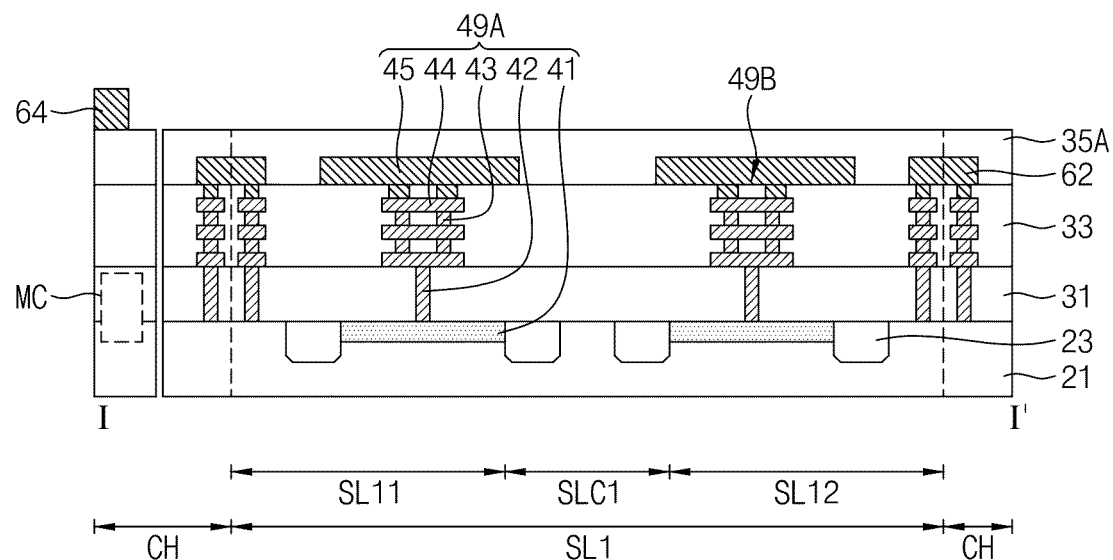

Referring to FIG. 27, an upper wiring 64 may be formed on the first upper insulation layer 35A of each of the plurality of chip regions CH. A process of forming the upper wiring 64 may include a process of forming a thin film and a patterning process.

Figure 28:
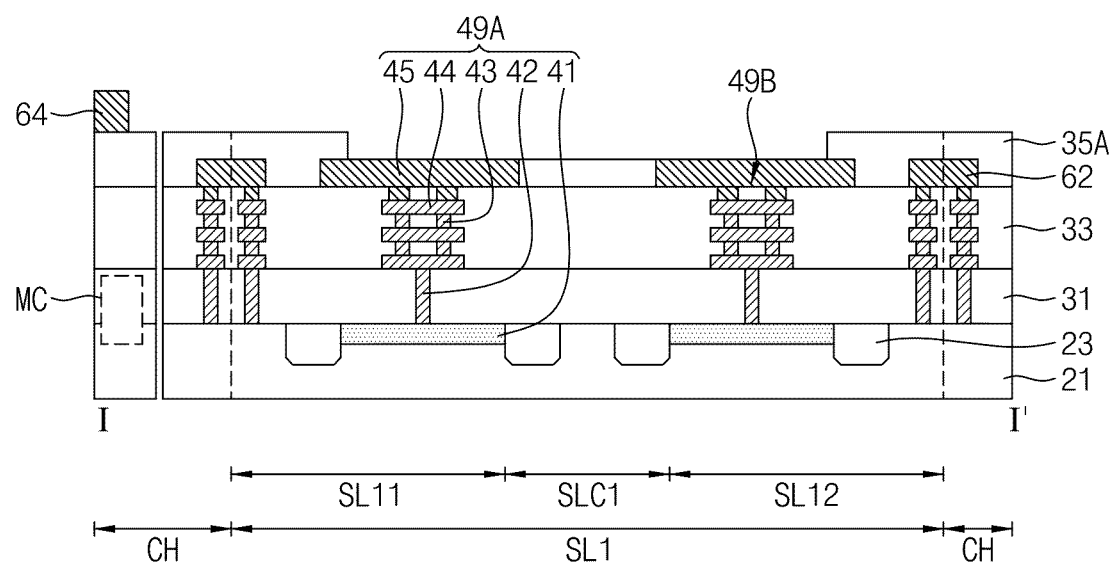

Referring to FIG. 28, an upper surface of the test pad 45 may be exposed by partially removing the first upper insulation layer 35A.

Figure 29:
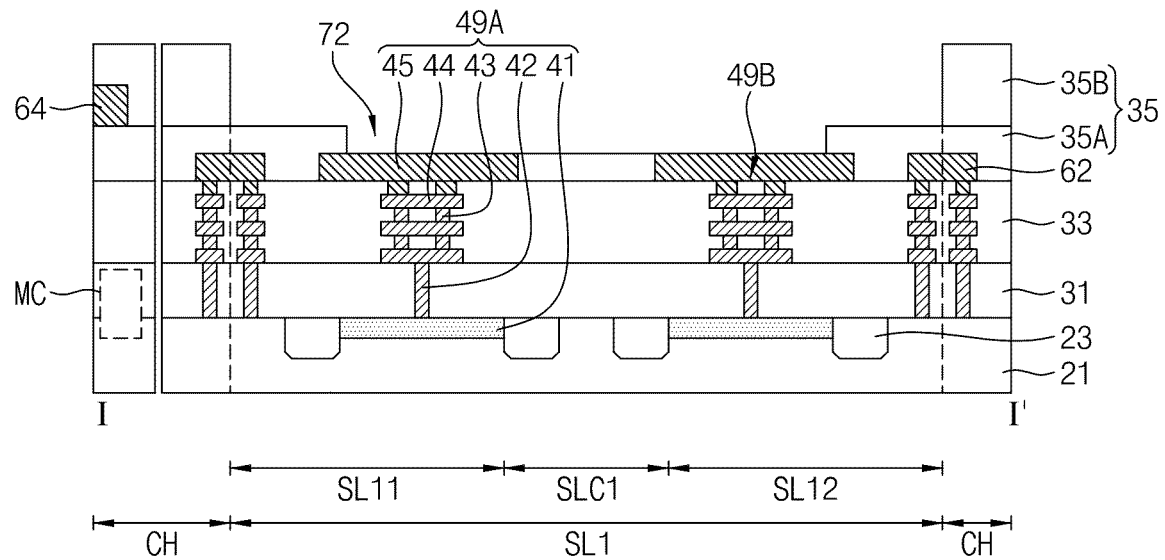

Referring to FIG. 29, a second upper insulation layer 35B may be formed on the first upper insulation layer 35A of each of the plurality of chip regions CH. The second upper insulation layer 35B may cover the upper wiring 64. An opening portion 72 passing through the second upper insulation layer 35B may be formed on the first scribe lane SL1. Upper surfaces of the first upper insulation layer 35A and the test pad 45 may be exposed by the opening portion 72.

Referring again to FIG. 1, a division hole 71 may be formed to overlap a first division region SLC1. The division hole 71 may be connected to the opening portion 72.

Figure 30:
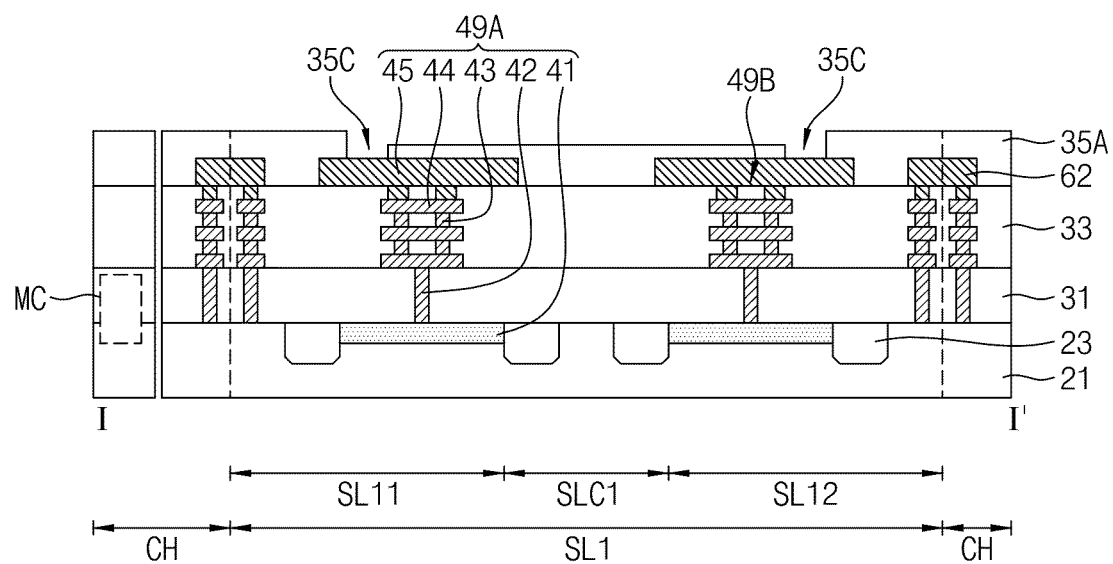
Figure 31:
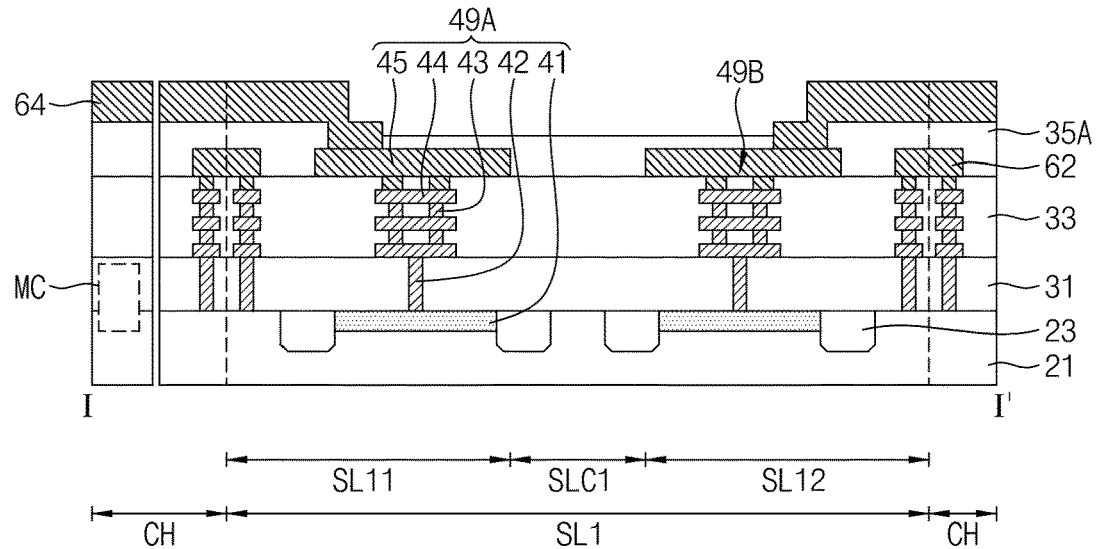

FIGS. 30 and 31 are cross-sectional views of a semiconductor wafer taken along line I-I' of FIG. 7, for describing methods of manufacturing semiconductor devices according to an embodiment.

Referring to FIG. 30, a redistribution hole 35C partially exposing an upper surface of the test pad 45 may be formed by partially removing the first upper insulation layer 35A.

Referring to FIG. 31, an upper wiring 64 may be formed on the first upper insulation layer 35A. The upper wiring 64 may be formed on the first upper insulation layer 35A of each of the plurality of chip regions CH and may extend to the first scribe lane SL1. The upper wiring 64 may contact the test pad 45.

Referring again to FIG. 13, a second upper insulation layer 35B may be formed on the upper wiring 64 and the first upper insulation layer 35A. An opening portion 72 passing through the second upper insulation layer 35B may be formed on the first scribe lane SL1. A division hole 71 may be formed to overlap the first division region SLC1. The division hole 71 may be connected to the opening portion 72.

Subsequently, the chip regions CH described above with reference to FIGS. 1 to 31 may be divided into semiconductor devices by cutting the wafer along the first division region SLC1 and the second division region SLC2. A process of cutting the wafer along the first division region SLC1 and the second division region SLC2 may include a sawing process using a laser sawing apparatus or a sawing blade. Each of the semiconductor devices may have a partial structure of each of the first and second scribe lanes SL1 and SL2, in addition to a respective chip region CH.

Figure 32:
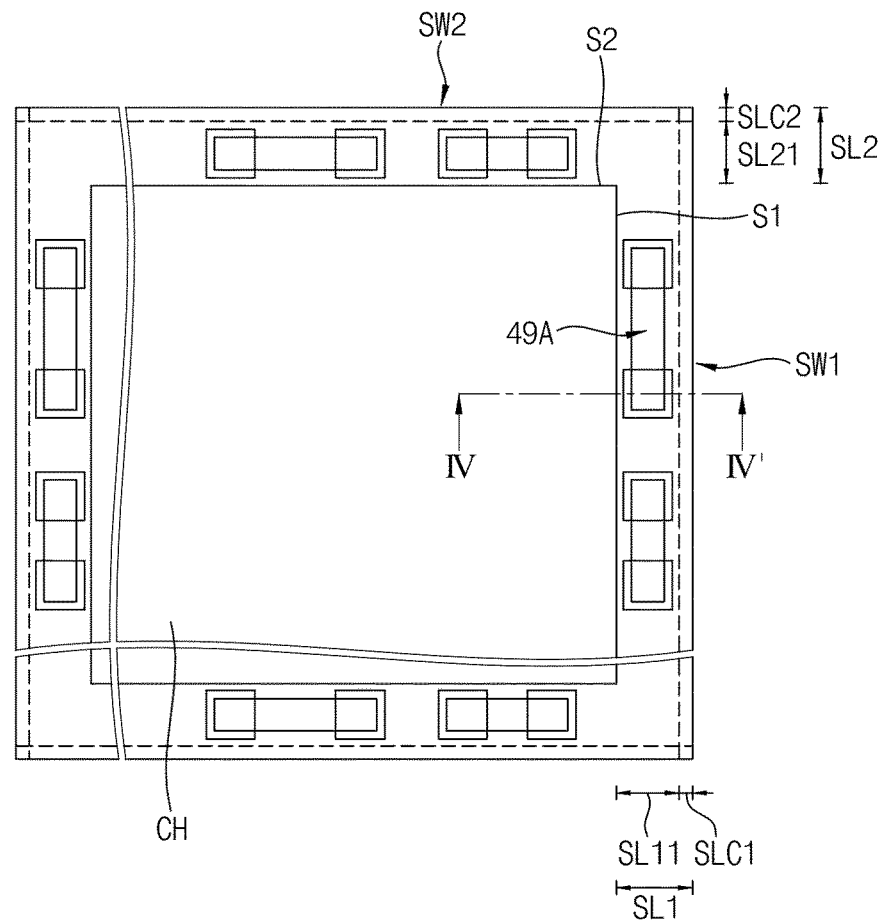
FIG. 32 is a layout for describing a semiconductor device according to an exemplary embodiment of the present inventive concept.
Figure 33:
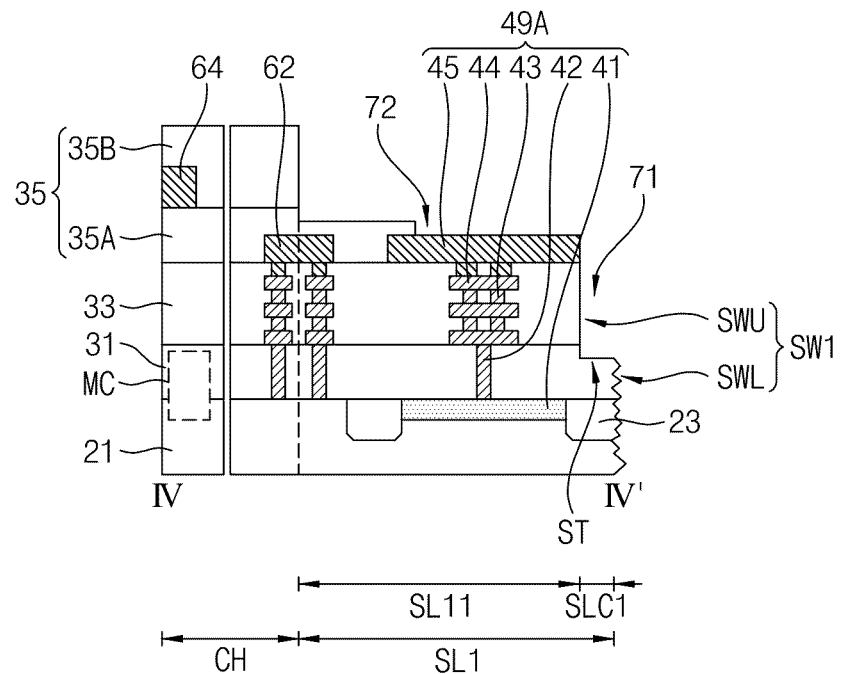
FIGS. 33 to 35 are cross-sectional views of a semiconductor device according to an exemplary embodiment of the present inventive concept.
Figure 34:
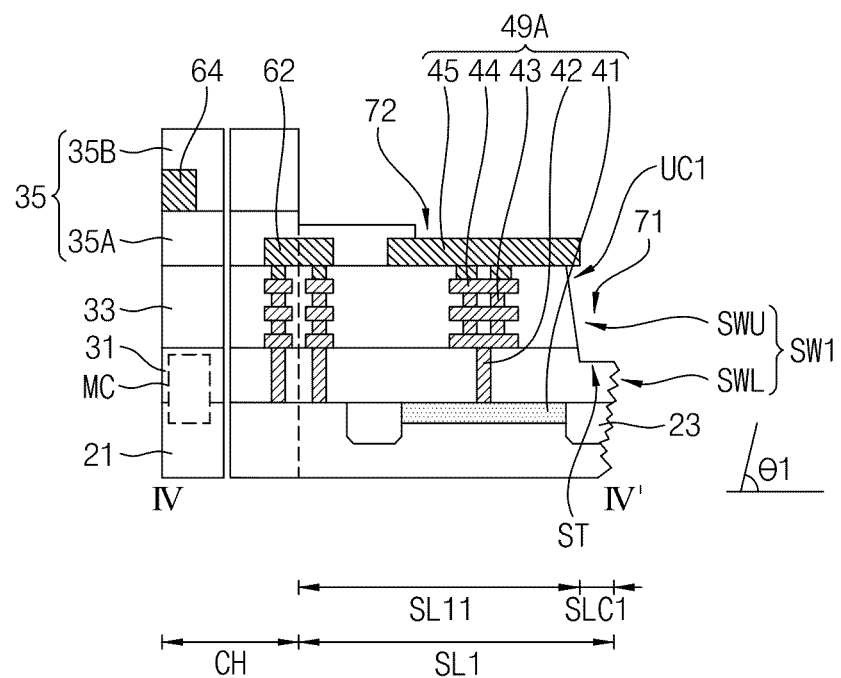
Figure 35:
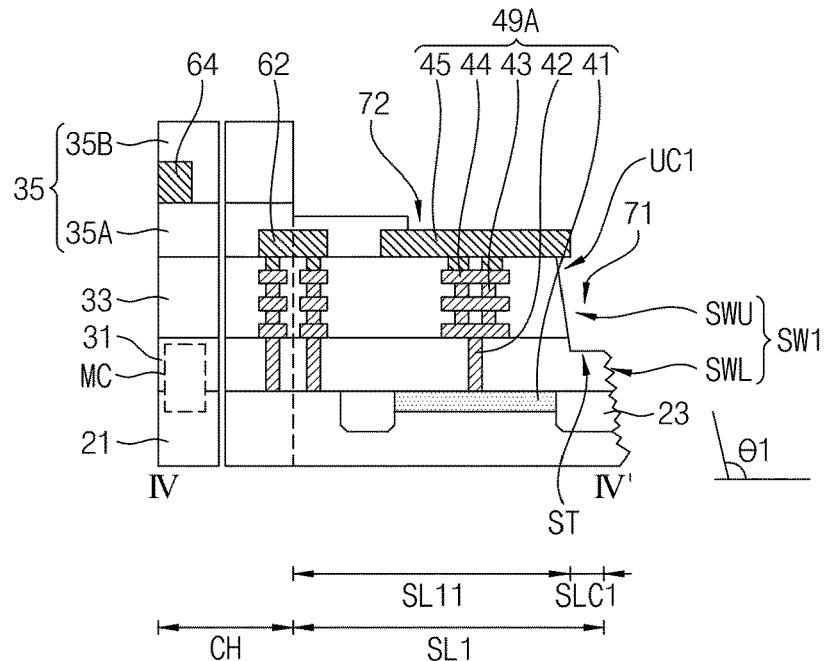
Figure 36:
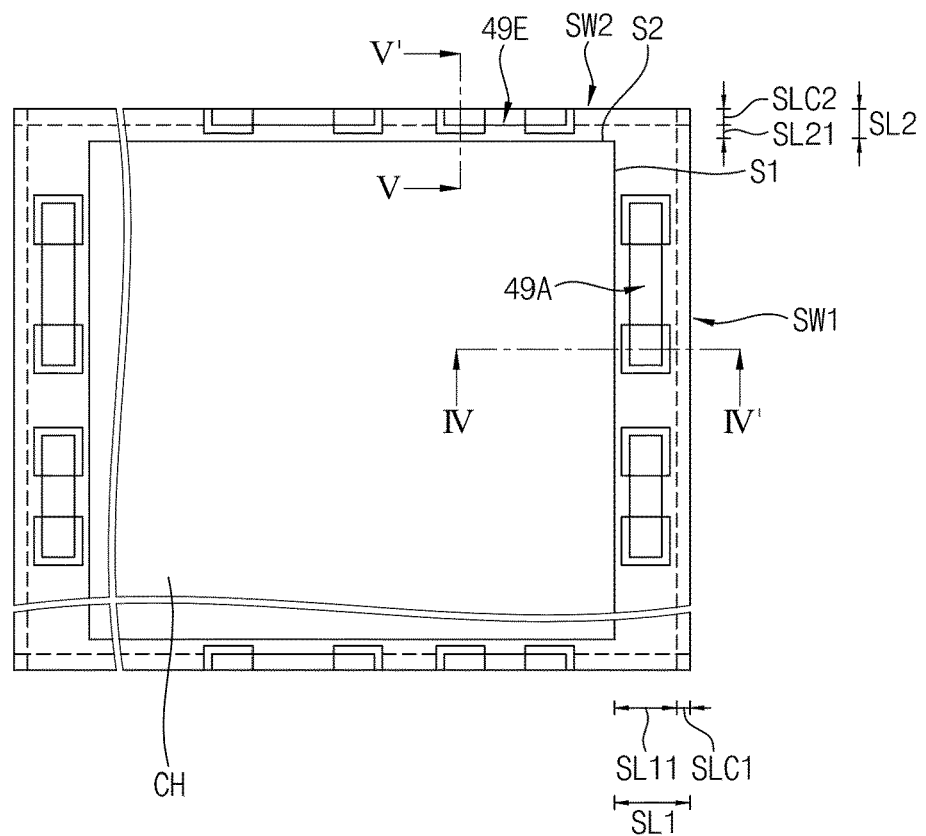
FIG. 36 is a layout for describing a semiconductor device according to an exemplary embodiment of the present inventive concept.
Figure 37:
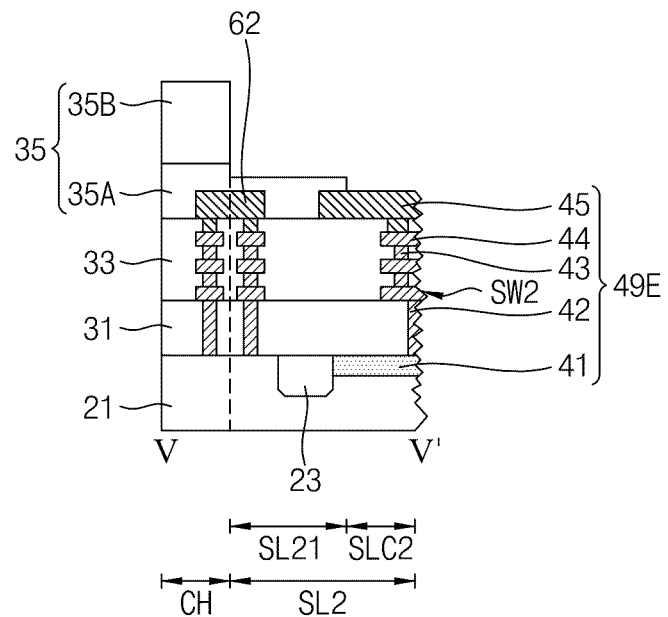
FIG. 37 is a cross-sectional view of a semiconductor device according to an exemplary embodiment of the present inventive concept.

FIGS. 32 and 36 are layouts for describing a semiconductor device according to an embodiment, FIGS. 33 to 35 are cross-sectional views taken along line IV-IV' of FIG. 32, for describing a semiconductor device according to an embodiment, and FIG. 37 is a cross-sectional view taken along line V-V' of FIG. 36, for describing a semiconductor device according to an embodiment.

Referring to FIGS. 32 and 33, a semiconductor device according to an embodiment may include a substrate 21 separated from a semiconductor wafer. The substrate 21 may include a chip region CH, and first and second scribe lanes SL1 and SL2. The semiconductor may further include a first pattern group 49A, a plurality of insulation layers 23, 31, 33, and 35, a division hole 71, an opening portion 72, a memory cell MC, a plurality of guard rings 62, and an upper wiring 64. Each of the substrate 21, the chip region CH, the first and second scribe lanes SL1 and SL2, the first pattern group 49A, the insulation layers 23, 31, 33, and 35, the division hole 71, the opening portion 72, the memory cell MC, the plurality of guard rings 62, and the upper wiring 64 may include a configuration similar to a corresponding configuration described above with reference to FIGS. 1 to 31. The insulation layers 23, 31, 33, and 35 may include an isolation layer 23, a lower insulation layer 31, a middle insulation layer 33, and an upper insulation layer 35.

In an embodiment, the substrate 21 may include the chip region CH and the first and second scribe lanes SL1 and SL2. The first scribe lane SL1 may be connected to a first side S1 of the chip region CH, and the second scribe lane SL2 may be connected to a second side S2 of the chip region CH. The first scribe lane SL1 may include a first region SL11 and a first division region SLC1. In an example embodiment, the first division region SLC1 of the semiconductor device may have a horizontal width less than a half of a horizontal width of the first division region SLC1 of the wafer due to loss in a sawing process. The first region SL11 may be disposed between the first division region SLC1 and the chip region CH. The first pattern group 49A may be disposed on the first region SL11.

A portion of the insulation layers 23, 31 and 33 (i.e., the bottom insulation layer) may overlap the first scribe lane SL1. The portion of the bottom insulation layer may include a first sidewall SW1 corresponding to a sidewall of the semiconductor device. The first sidewall SW1 may include an upper sidewall SWU and a lower sidewall SWL. The first sidewall SW1 may be aligned in the first division region SLC1. For example, the first sidewall SW1 may locate at a boundary between the first region SL11 and the division hole 71. The lower sidewall SWL may be disposed under the upper sidewall SWU. A surface of the upper sidewall SWU may be determined based on the division hole 71. The lower sidewall SWL may have surface roughness which differs from that of the upper sidewall SWU. The lower sidewall SWL may include a surface which is rougher than that of the upper sidewall SWU.

The upper sidewall SWU may correspond to a sidewall of the middle insulation layer 33 and a portion of a sidewall of the lower insulation layer 31. The lower sidewall SWL may correspond to the other portion of the sidewall of the lower insulation layer 31 and a sidewall of the isolation layer 23.

The isolation layer 23 may be buried in the substrate 21. At least a portion of each of the insulation layers 23, 31, and 33 (i.e., collectively the bottom insulation layer) may extend into a portion between the side sidewall SW1 and the first pattern group 49A. For example, a portion of the bottom insulation layer may be disposed between the side sidewall SW1 and the first pattern group 49A. The first pattern group 49A may include a TEG, an align key pattern, or a combination thereof.

In an embodiment, the first pattern group 49A may include a test pad 45, a plurality of middle wirings 44, a plurality of middle plugs 43, a lower plug 42, and a test pattern 41. The test pad 45 may be disposed on the test pattern 41 and may be electrically connected to the test pattern 41.

In an embodiment, the test pattern 41 may be disposed (i.e., buried) in the substrate 21. The isolation layer 23 may be disposed between the lower sidewall SWL and the test pattern 41. In an embodiment, the test pattern 41 may be disposed in the lower insulation layer 31. The lower insulation layer 31 may extend to a portion between the lower sidewall SWL and the lower plug 42. For example, a portion of the lower insulation layer 31 may be disposed between the lower sidewall SWL and the lower plug 42.

In an example embodiment, the bottom insulation layer 23, 31 and 33 may include a portion on the first scribe lane SL1, and the portion of the bottom insulation layer 23, 31 and 33 may include a stepped sidewall. The stepped sidewall may include the lower sidewall SWL, the upper sidewall SWU and a stepped portion ST (i.e., a connecting surface) disposed therebetween. The stepped portion ST may connect the lower sidewall SWL and the upper sidewall SWU. The stepped portion ST may be determined based on a bottom of the division hole 71. The stepped portion ST may correspond to a recessed upper surface of the lower sidewall SWL. The boundary between the lower sidewall SWL and the upper sidewall SWU may correspond to the recessed upper surface of the lower insulation layer 31. In an embodiment, the boundary between the lower sidewall SWL and the upper sidewall SWU may correspond to an upper surface of a portion of the lower insulation layer 31. (See, FIG. 10 showing a semiconductor wafer before a sawing process is applied to form a semiconductor device.) The portion of the lower insulation layer 31 may be exposed by the middle insulation layer 33. The middle insulation layer 33 may include a material layer which is greater in tensile strength than the lower insulation layer 31. The middle insulation layer 33 may include a SiCN layer.

In an embodiment, the second scribe lane SL2 may include a configuration similar to that of the first scribe lane SL1.

Referring to FIG. 34, a lower sidewall SWL may have a slope which differs from that of an upper sidewall SWU. The upper sidewall SWU may be determined based on the division hole 71. The lower sidewall SWL may be determined by a sawing process. The lower sidewall SWL and a lower surface of the substrate 21 may have a first slope θ1 therebetween. In an embodiment, the first slope θ1 may have an angle between about 75 degrees and about 90 degrees.

Referring to FIG. 35, the lower sidewall SWL and the lower surface of the substrate 21 may have a first slope θ1 therebetween. In an embodiment, the first slope θ1 may have an angle between about 90 degrees and about 105 degrees.

Referring to FIGS. 36 and 37, a semiconductor device according to an embodiment may include a substrate 21, a chip region CH, first and second scribe lanes SL1 and SL2, a first pattern group 49A, a third pattern group 49E, a plurality of insulation layers 23, 31, 33, and 35, and a plurality of guard rings 62. Each of the substrate 21, the chip region CH, the first and second scribe lanes SL1 and SL2, the first pattern group 49A, the third pattern group 49E, the insulation layers 23, 31, 33, and 35, and the plurality of guard rings 62 may include a configuration similar to a corresponding configuration described above with reference to FIGS. 1 to 31. The first scribe lane SL1 may include a configuration similar to a configuration described above with reference to FIGS. 32 to 35.

In an embodiment, the second scribe lane SL2 may be connected to a second side S2 of the chip region CH. The second scribe lane SL2 may have a width which is narrower than that of the first scribe lane SL1. The second scribe lane SL2 may include a third region SL21 and a second division region SLC2. The third region SL21 may be disposed between the second division region SLC2 and the chip region CH. The third pattern group 49E may be disposed on the third region SL21. A second sidewall SW2 of the second scribe lane SL2 may be aligned in the second division region SLC2. The third pattern group 49E may be exposed at the second sidewall SW2. The third pattern group 49E may include a TEG, an align key pattern, or a combination thereof. In an exemplary embodiment, the third pattern group 49 may be not operate as intended due to the cut made in a sawing process.

In an embodiment, the third pattern group 49E may include a test pad 45, a plurality of middle wirings 44, a plurality of middle plugs 43, a lower plug 42, and a test pattern 41. At least one of the test pattern 41, the lower plug 42, the plurality of middle plugs 43, the plurality of middle wirings 44, and the test pad 45 may be exposed at the second sidewall SW2. For example, the test pattern 41 and the test pad 45 may be exposed at the second sidewall SW2. The second sidewall SW2 may have surface roughness which differs from that of the first sidewall SW1. The second sidewall SW2 may include a surface which is rougher than that of the first sidewall SW1 as described with reference to FIGS. 33, 34 and 35, for example. A side surface of the third pattern group 49E may include a surface which is rougher than a side surface of the first pattern group 49A. The second sidewall SW2 may be determined by a sawing process.

Figure 38:
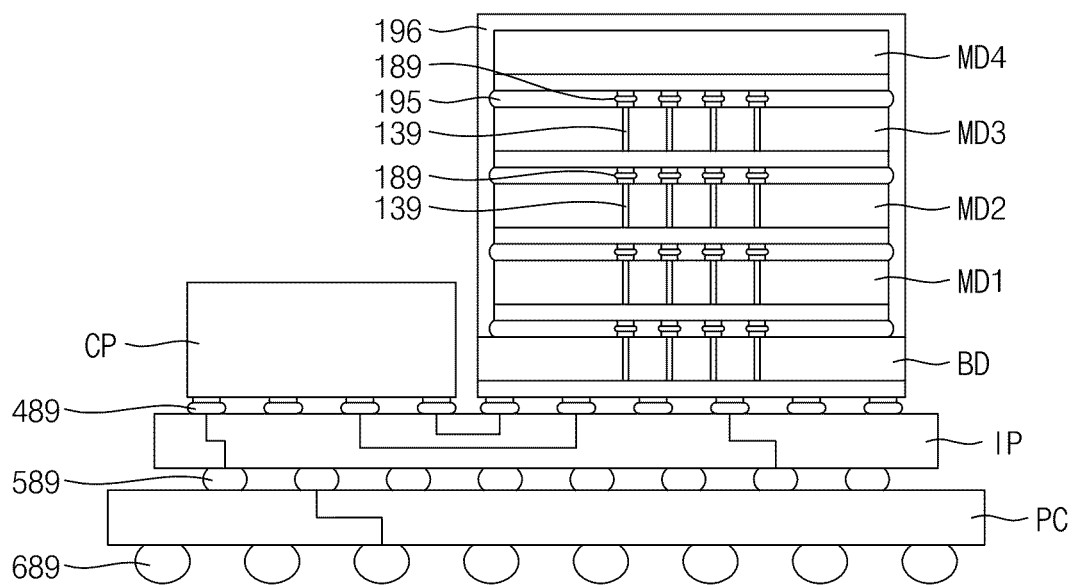
FIGS. 38 and 39 are cross-sectional views of a semiconductor device according to an exemplary embodiment of the present inventive concept.
Figure 39:
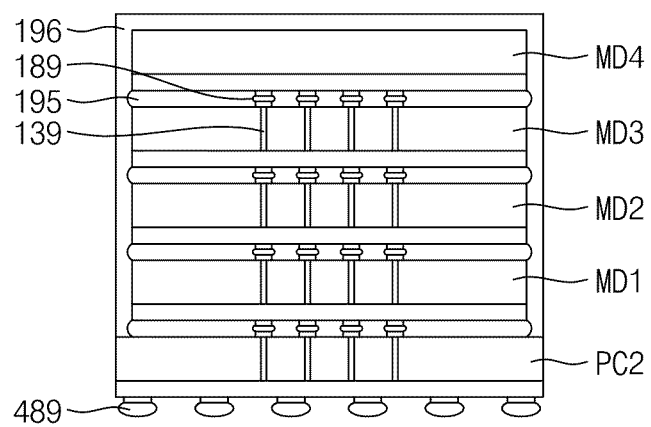

FIGS. 38 and 39 are cross-sectional views for describing a semiconductor device according to an embodiment. The semiconductor device according to an embodiment may include hybrid memory cube (HMC), high bandwidth memory (HBM), double data rate fifth-generation (DDR5) DRAM, or a combination thereof.

Referring to FIG. 38, a semiconductor device according to an embodiment may include a printed circuit board PC, an interposer substrate IP, a plurality of semiconductor chips CP, BD, and MD1 to MD4, a plurality of bumps 189, 489, 589, and 689, an adhesive layer 195, and an encapsulation material 196. The plurality of semiconductor chips CP, BD, and MD1 to MD4 may include a microprocessor CP, a base chip BD, and a plurality of memory chips MD1 to MD4. In an embodiment, the plurality of memory chips MD1 to MD4 may be sequentially and vertically stacked on the base chip BD. The plurality of memory chips MD1 to MD4 may include memory chips corresponding to a combination of various numbers such as three, four, seven, eleven, twelve, fifteen, sixteen, and nineteen. The plurality of memory chips MD1 to MD4 may include a first memory chip MD1, a second memory chip MD2, a third memory chip MD3, and a fourth memory chip MD4. At least some of the plurality of memory chips MD1 to MD4 may include a plurality of through electrodes 139. The plurality of bumps 189, 489, 589, and 689 may include a plurality of first bumps 189, a plurality of second bumps 489, a plurality of third bumps 589, and a plurality of fourth bumps 689.

The printed circuit board PC may include a rigid printed circuit board, a flexible printed circuit board, or a rigid-flexible printed circuit board. The printed circuit board PC may include a multilayer circuit board. The printed circuit board PC may correspond to a package board or a main board. The plurality of fourth bumps 689 may be disposed on a lower surface of the printed circuit board PC. The interposer substrate IP may be disposed on the printed circuit board PC. The plurality of third bumps 589 may be disposed between the printed circuit board PC and the interposer substrate IP.

The plurality of semiconductor chips CP, BD, and MD1 to MD4 may be disposed on the interposer substrate IP. The interposer substrate IP may include a semiconductor substrate such as a silicon interposer. In an embodiment, the microprocessor CP and the base chip BD may be disposed on the interposer substrate IP. The plurality of second bumps 489 may be disposed between the microprocessor CP and the interposer substrate IP and between the base chip BD and the interposer substrate IP. The microprocessor CP may include various kinds of processors such as a graphics processing unit (GPU) or an application processor (AP). The base chip BD may include various elements such as a memory controller. The base chip BD may be connected to the microprocessor CP via the interposer substrate IP and the plurality of second bumps 489.

The plurality of memory chips MD1 to MD4 may be sequentially stacked on the base chip BD. Each of the plurality of memory chips MD1 to MD4 may include a plurality of elements similar to elements described above with reference to FIGS. 1 to 37. For example, each of the plurality of memory chips MD1 to MD4 may include the substrate 21, the memory cell MC, and the first and second scribe lanes SL1 and SL2. The plurality of through electrodes 139 may be disposed in the plurality of chip region. The plurality of through electrodes 139 may pass through the chip region of the substrate in each of the memory chips MD1 to MD4.

In an embodiment, the adhesive layer 195 may be disposed between the plurality of memory chips MD1 to MD4 and between the first memory chip MD1 and the base chip BD. The adhesive layer 195 may include a non-conductive film (NCF). The plurality of first bumps 189 may be disposed between the plurality of memory chips MD1 to MD4 and between the first memory chip MD1 and the base chip BD. The plurality of first bumps 189 may extend to an inner portion of the adhesive layer 195. The plurality of first bumps 189 may pass through the adhesive layer 195. The plurality of memory chips MD1 to MD4 may be connected to the base chip BD via the plurality of first bumps 189 and the plurality of through electrodes 139. The encapsulation material 196 covering the plurality of memory chips MD1 to MD4 may be disposed on the base chip BD. The encapsulation material 196 may include an epoxy molding compound (EMC).

In an embodiment, the base chip BD may include a buffer chip, a logic chip, or a combination thereof. Each of the plurality of memory chips MD1 to MD4 may correspond to a DRAM core chip. In an embodiment, the first memory chip MD1 may correspond to a master chip. Each of the second memory chip MD2, the third memory chip MD3, and the fourth memory chip MD4 may correspond to a slave chip.

Referring to FIG. 39, a semiconductor device according to an embodiment may include a plurality of memory chips MD1 to MD4 which are sequentially stacked on a package board PC2. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

The package board PC2 may include a printed circuit board such as a rigid printed circuit board, a flexible printed circuit board, or a rigid-flexible printed circuit board. The plurality of memory chips MD1 to MD4 may include a first memory chip MD1, a second memory chip MD2, a third memory chip MD3, and a fourth memory chip MD4. An adhesive layer 195 may be disposed between the plurality of memory chips MD1 to MD4 and between the first memory chip MD1 and the package board PC2. The adhesive layer 195 may include an NCF. The plurality of memory chips MD1 to MD4 may be connected to the package board PC2 via a plurality of first bumps 189 and a plurality of through electrodes 139. An encapsulation material 196 covering the plurality of memory chips MD1 to MD4 may be disposed on the package board PC2. The encapsulation material 196 may include an EMC. A plurality of second bumps 489 may be disposed on a lower surface of the package board PC2.

In an embodiment, the first memory chip MD1 may correspond to a master chip. Each of the second memory chip MD2, the third memory chip MD3, and the fourth memory chip MD4 may correspond to a slave chip. Each of the plurality of memory chips MD1 to MD4 may include a plurality of elements similar to elements described above with reference to FIGS. 1 to 37. For example, each of the plurality of memory chips MD1 to MD4 may include the substrate 21, the memory cell MC, and the first and second scribe lanes SL1 and SL2. The plurality of through electrodes 139 may be disposed in the plurality of chip regions CH. The plurality of through electrodes 139 may pass through the chip region of the substrate in each of the memory chips MD1 to MD4.

According to the embodiments, the first pattern group may be disposed on the first region of the scribe lane. The second pattern group may be disposed on the second region of the scribe lane. The division hole may overlap the division region between the first region and the second region of the scribe lane. Each of the first pattern group and the second pattern group may include the test element group, the align key pattern, or a combination thereof. A semiconductor device where the test element group and the align key pattern are efficiently disposed may be implemented.

While the inventive concept has been particularly shown and described with reference to embodiments thereof, it will be understood that various changes in form and details may be made therein without departing from the spirit and scope of the following claims.

What is claimed is:
1. A semiconductor device comprising:
   a substrate including a chip region, a first scribe lane, and a second scribe lane, the first scribe lane on a first side of the chip region, the second scribe lane on a second side of the chip region, the first side of the chip region being perpendicular to the second side of the chip region;
a memory cell structure on the chip region of the substrate;
a first insulation layer disposed on the substrate and covering the memory cell structure, the first insulation layer having a first sidewall that is disposed on the first scribe lane of the substrate, and a second sidewall that is disposed between the first sidewall and the first scribe lane of the substrate;
a pattern group on the first scribe lane of the substrate, the pattern group including a first wiring that is disposed in the first insulation layer, and a second wiring that is disposed on the first insulation layer;
a second insulation layer disposed on the first insulation layer and exposing a top surface of the second wiring of the pattern group; and
a third wiring on the second insulation layer,
wherein the first wiring and the second wiring of the pattern group are in electrical contact with each other,
the third wiring is spaced apart from the second wiring of the pattern group,
a thickness of the third wiring in a direction that is perpendicular to a top surface of the substrate is greater than a thickness of at least one of the first wiring, or the second wiring of the pattern group in the direction, and surface roughness of the first sidewall of the first insulation layer differs from surface roughness of a sidewall of the first scribe lane of the substrate.

2. The semiconductor device of claim 1, wherein the surface roughness of the first sidewall of the first insulation layer differs from surface roughness of a sidewall of the second sidewall of the first insulation layer.

3. The semiconductor device of claim 1, wherein a width of the first scribe lane of the substrate is greater than a width of the second scribe lane of the substrate.

4. The semiconductor device of claim 1, wherein the second insulation layer exposes a side surface of the second wiring of the pattern group.

5. The semiconductor device of claim 1, wherein the first insulation layer includes a connecting surface that is disposed between the first sidewall and the second sidewall of the first insulation layer.

6. The semiconductor device of claim 1, wherein the first insulation layer includes a recess portion that exposes a bottom surface of the second wiring of the pattern group.

7. The semiconductor device of claim 1, wherein the first wiring of the pattern group includes copper, and each of the second wiring of the pattern group and the third wiring includes aluminum.

* * * * *